(12) United States Patent
Song et al.

(10) Patent No.: US 12,369,377 B2
(45) Date of Patent: Jul. 22, 2025

(54) SEMICONDUCTOR STRUCTURE AND FORMING METHOD THEREOF

(71) Applicant: TAIWAN SEMICONDUCTOR MANUFACTURING COMPANY LTD., Hsinchu (TW)

(72) Inventors: Jhu-Min Song, Nantou County (TW); Chien-Chih Chou, New Taipei (TW); Yu-Chang Jong, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 585 days.

(21) Appl. No.: 17/709,307

(22) Filed: Mar. 30, 2022

(65) Prior Publication Data

US 2023/0317821 A1 Oct. 5, 2023

(51) Int. Cl.
| | | |
|---|---|---|
| *H10D 84/85* | (2025.01) | |
| *H10D 64/01* | (2025.01) | |
| *H10D 64/27* | (2025.01) | |
| *H10D 64/66* | (2025.01) | |
| *H10D 84/01* | (2025.01) | |
| *H10D 84/03* | (2025.01) | |

(52) U.S. Cl.
CPC ....... *H10D 64/017* (2025.01); *H10D 84/0174* (2025.01); *H10D 84/038* (2025.01); *H10D 84/856* (2025.01); *H10D 64/01* (2025.01); *H10D 64/513* (2025.01); *H10D 64/661* (2025.01); *H10D 64/665* (2025.01)

(58) Field of Classification Search
CPC .............. H01L 27/0922; H01L 27/088; H01L 29/4236; H01L 21/823456
See application file for complete search history.

(56) References Cited

U.S. PATENT DOCUMENTS

| | | | | |
|---|---|---|---|---|
| 2013/0037853 A1* | 2/2013 | Onozawa | .......... | H01L 29/41766 257/E29.198 |
| 2014/0054644 A1* | 2/2014 | Hikasa | ................ | H10D 62/115 257/139 |
| 2021/0265344 A1* | 8/2021 | Chen | ................... | H01L 29/0649 |
| 2023/0246030 A1* | 8/2023 | Huang | ................ | H01L 27/0922 257/500 |

\* cited by examiner

*Primary Examiner* — Erik Kielin
(74) *Attorney, Agent, or Firm* — WPAT Law; Anthony King

(57) ABSTRACT

A semiconductor structure and forming method thereof are provided. A substrate includes a region. A first gate structure and a sacrificial gate structure are recessed in the substrate and disposed in the region. The sacrificial gate structure is adjacent to the first gate structure. A first contact is electrically connected to the first gate structure. A sacrificial gate masking structure is disposed over the sacrificial gate structure. An upper surface of the sacrificial gate structure is entirely covered by the sacrificial gate masking structure.

20 Claims, 21 Drawing Sheets

SEMICONDUCTOR STRUCTURE AND FORMING METHOD THEREOF

BACKGROUND

The semiconductor integrated circuit (IC) industry has experienced exponential growth over the last few decades. As a result of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been replacement of a polysilicon gate electrode of a logic core with a metal gate electrode and a high-k dielectric, also known as an HKMG replacement gate device, to improve performance of devices having the decreased feature sizes. High-voltage devices are integrated on a same chip with an HKMG logic core, and support the logic core to accomplish an intended function and limit or eliminate inter-chip communication.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
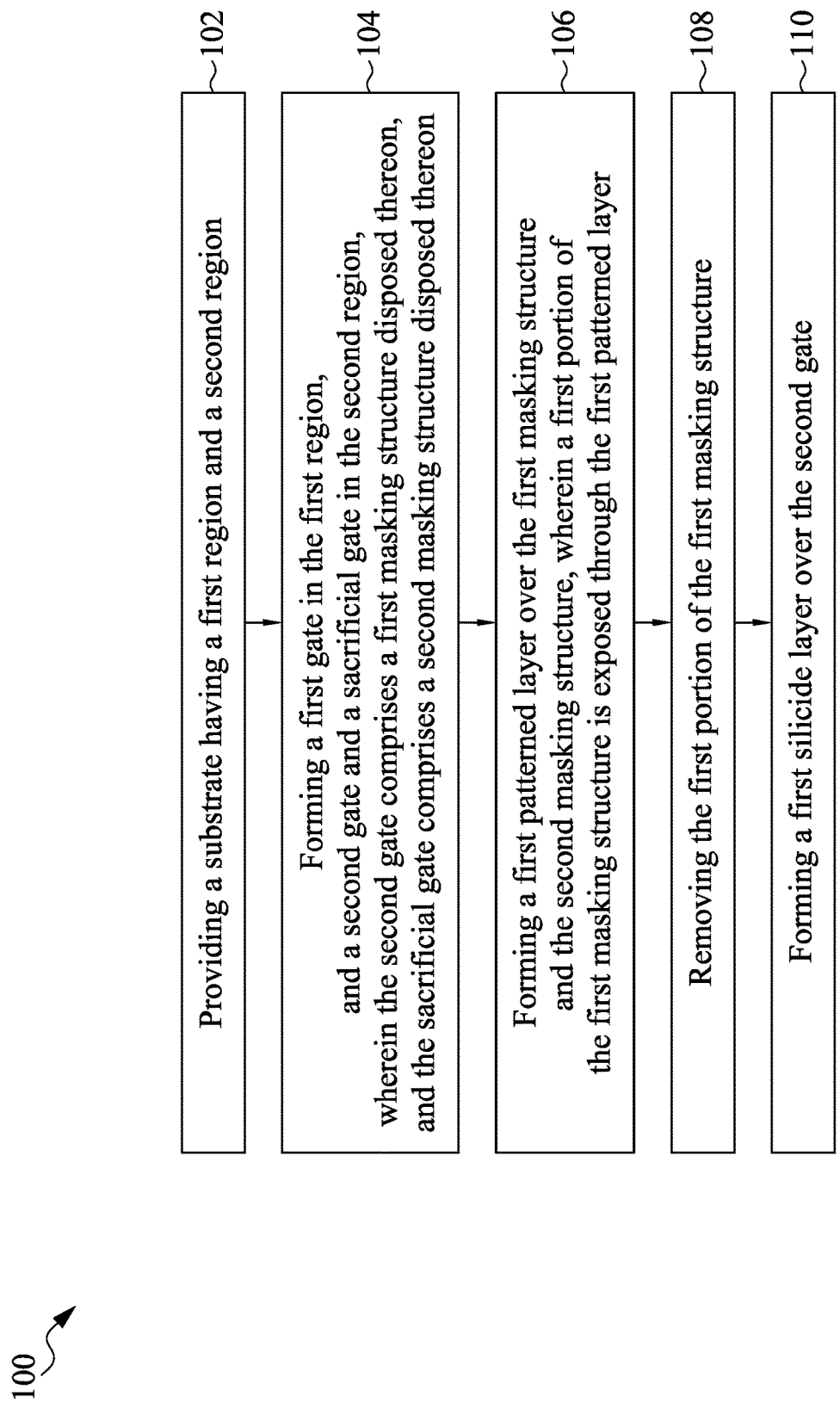
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

High-k metal gate (HKMG) technology has become a leading candidate for a next generation of CMOS devices. By combining a metal gate electrode and a high-k dielectric, HKMG technology makes further scaling possible and allows integrated chips to function with reduced power. However, there are challenges to integrating HKMG devices and high-voltage devices. A problem associated with such integrated circuits is presence of topography gaps between a high-voltage region where the high-voltage devices reside and a low-voltage region where low-voltage devices reside. For example, gate dielectrics for the high-voltage device and the low-voltage device often require different thicknesses and thus may need to be processed separately. The topography gaps may cause non-correctable focus errors (NCE) during subsequent lithography operations. Accordingly, an alternative approach to forming a semiconductor structure that integrates the high-voltage device and the low-voltage device is therefore of primary importance.

Some embodiments of the present disclosure provide a semiconductor structure and a forming method thereof that provide one or more improvements over existing approaches. The method includes removing a portion of a gate masking structure overlapping a high-voltage device. An upper surface of a sacrificial gate masking structure in a high-voltage region is configured to be aligned with an upper surface of a low-voltage device in a low-voltage region, thus resulting in substantially no topography gaps. Moreover, most of the high-voltage region is protected by the gate masking structures or the sacrificial gate masking structures. Accordingly, topography gaps between the low-voltage region and the high-voltage region may be significantly reduced, and fewer non-correctable focus errors may be expected.

FIG. 1 is a flowchart representing a method 100 for forming a semiconductor structure according to aspects of one or more embodiments of the present disclosure. The method 100 for forming the semiconductor structure includes an operation 102, in which a substrate is provided. In some embodiments, the substrate has a first region and a second region. The method 100 further includes an operation 104, in which a first gate is formed in the first region, and a second gate and a sacrificial gate are formed in the second region. In some embodiments, the second gate includes a first masking structure disposed thereon, and the sacrificial gate includes a second masking structure disposed thereon. The method 100 further includes an operation 106, in which a first patterned layer is formed over the first masking structure and the second masking structure. In some embodiments, a first portion of the first masking structure is exposed through the first patterned layer. The method 100 further includes an operation 108, in which the first portion of the first masking structure is removed. The method 100 further includes an operation 110, in which a first silicide layer is formed over the second gate.

The method is described for a purpose of illustrating concepts of the present disclosure and the description is not intended to limit the present disclosure beyond what is explicitly recited in the claims. Additional operations can be provided before, during, and after the method described above and illustrated in FIG. 1, and some operations described can be replaced, eliminated, or rearranged for additional embodiments of the method.

FIGS. 2 to 13, 15 to 16, and 18 to 21 are cross-sectional views illustrating a semiconductor structure 200 at different fabrication stages constructed according to aspects of one or more embodiments of the present disclosure. FIGS. 14 and 17 are top views illustrating the semiconductor structure 200 at different fabrication stages constructed according to aspects of one or more embodiments of the present disclosure.

Figure 2:
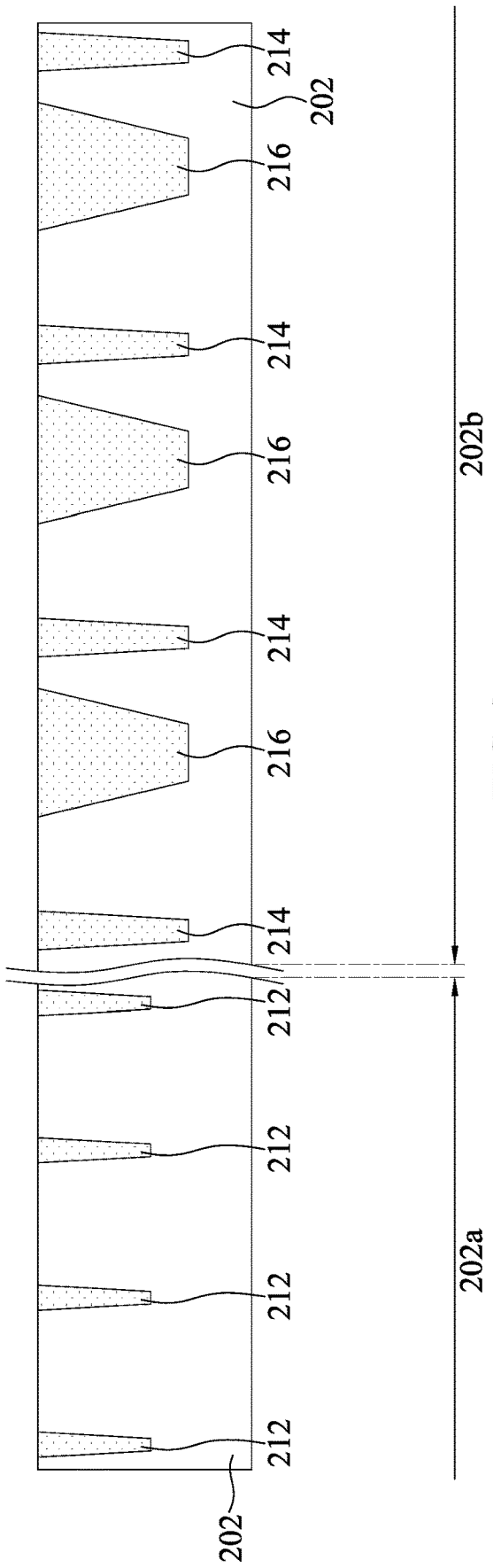
FIGS. 2 to 13, 15 to 16, and 18 to 21 are cross-sectional views illustrating a semiconductor structure at different fabrication stages constructed according to aspects of one or more embodiments of the present disclosure.

Referring to FIG. 2, in some embodiments, a substrate 202 is provided. The respective step is shown as operation 102 of the method 100 in FIG. 1. The substrate may include a first region 202a and a second region 202b. The first region 202a and the second region 202b may be configured as a low-voltage region 202a and a high-voltage region 202b, respectively. In various embodiments, the substrate 202 may include any type of semiconductor body (e.g., silicon/CMOS bulk, SiGe, SOI, etc.) such as a semiconductor wafer or one or more dies on a wafer, as well as any other type of semiconductor material.

In some embodiments, isolation structures 212, 214 and 216 may be formed within the substrate 202. The isolation structures 212, 214 and 216 may be formed by selectively etching the substrate 202 to form one or more trenches defined by sidewalls of the substrate 202. The trench is subsequently filled with one or more dielectric materials, such as, for example, silicon dioxide, forming the isolation structures 212, 214 and 216. The isolation structures 212, 214 and 216 may be shallow trench isolation (STI) structures or deep trench isolation (DTI) structures. The isolation structures 212, 214 and 216 formed in different regions may have different dimensions. For example, a depth of the isolation structure 212 formed in the first region 202a is less than a depth of the isolation structure 214 or 216 formed in the second region 202b. In some embodiments, a depth of the isolation structure 214 is substantially equal to a depth of the isolation structure 216. In some embodiments, a width of the isolation structure 216 is greater than a width of the isolation structure 214. The isolation structures 212, 214 and 216 may have upper surfaces aligned with an upper surface of the substrate 202. Alternatively, the isolation structures 212, 214 and 216 may protrude from the substrate 202 and may have upper surfaces at positions higher than the upper surface of the substrate 202.

FIGS. 3 to 11 illustrate a formation of a first gate structure in the first region, and a formation of a second gate structure and a sacrificial gate structure in the second region. The respective step is shown as operation 104 of the method 100 in FIG. 1.

Figure 3:
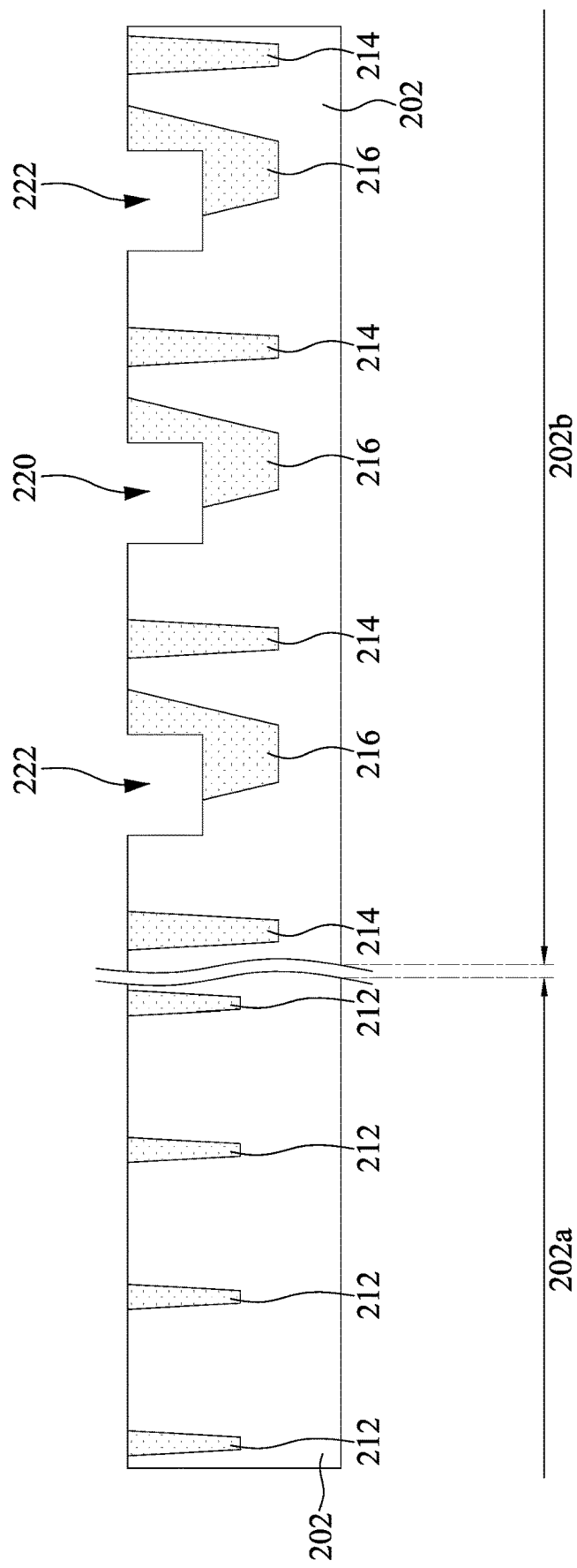

Referring to FIG. 3, in some embodiments, one or more trenches 220 and 222 are formed in an upper region of the substrate 202 as gate trenches in the second region 202b. The trenches 220 and 222 may be formed by one or more photolithography processes followed by one or more etching processes performed on the substrate 202 between the isolation structures 214 and 216. In some embodiments, a dimension of the trench 220 is substantially equal to a dimension of the trench 222. Alternatively, the trenches 220 and 222 formed in different areas may have different dimensions.

In some embodiments, the substrate 202 may next undergo ion implantation to form doped regions (e.g., n-type or p-type) between the isolation structures 212, 214 and 216, as device wells and other doped structures. For example, a first doped region (not shown) is formed between the isolation structures 212 as a low-voltage well. A second doped region (not shown) is formed between the isolation structures 214 and 216 as a high-voltage well. Alternatively or additionally, a deep well region (not shown) is formed in the substrate 202.

Figure 4:
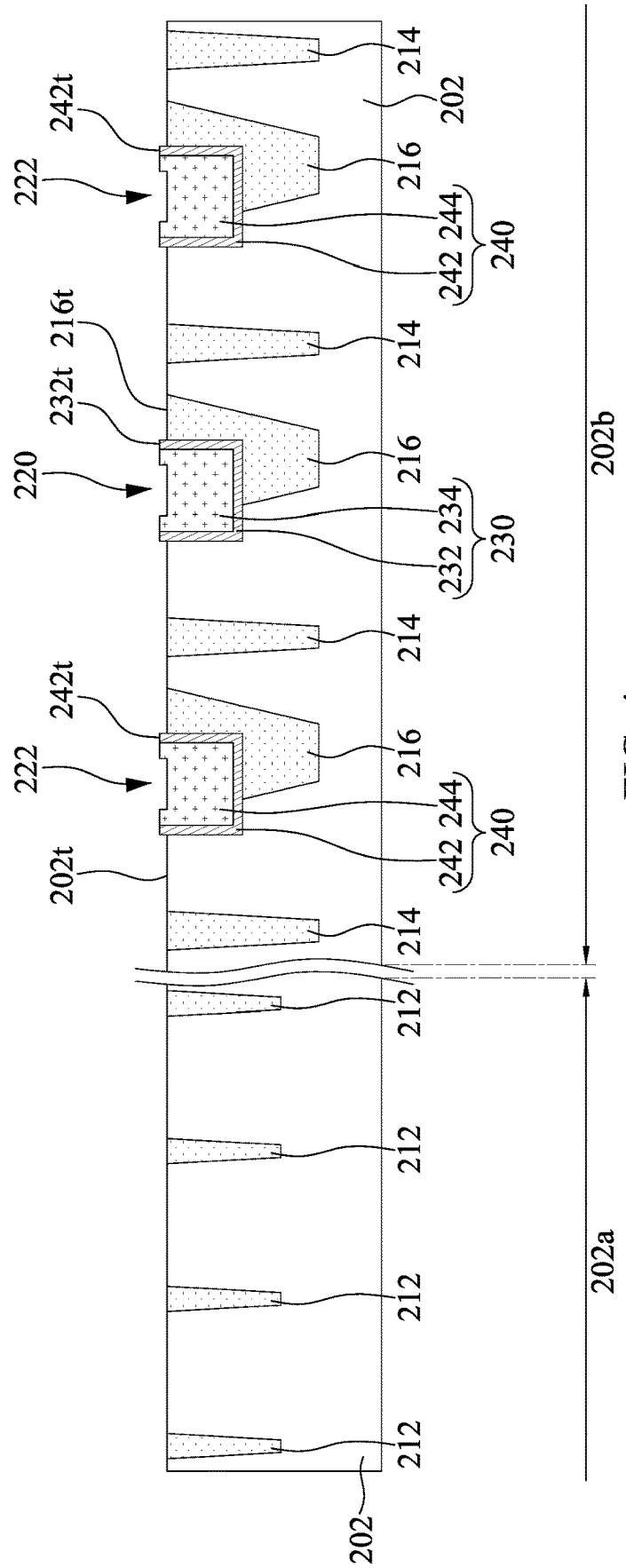

FIG. 4 illustrates a formation of a gate structure 230 and a sacrificial gate structure 240 in the second region 202b. Referring to FIG. 4, in some embodiments, a gate dielectric layer 232 and a gate dielectric layer 242 are formed along the trenches 220 and 222, respectively. The gate dielectric layers 232 and 242 may be configured as a high-voltage gate dielectric layer and a sacrificial gate dielectric layer, respectively. The gate dielectric layer 232 and the gate dielectric layer 242 may be formed by different thermal processes or deposition processes combined with patterning processes and may be formed with different thicknesses. The gate dielectric layer 232 and the gate dielectric layer 242 may be oxide layers, such as silicon dioxide layers, but other suitable gate dielectric materials are also applicable. The thicknesses of the gate dielectric layer 232 and the gate dielectric layer 242 depend on applications, ranging from several or tens of nanometers (nm) for current nodes to several angstroms (Å) for emerging nodes. In some embodiments, the gate dielectric layers 232 and 242 may be multi-layered structures, which may include different gate dielectric materials.

The gate dielectric layers 232 and 242 may protrude from the substrate 202 having upper surfaces 232t and 242t at positions higher than the upper surface 202t of the substrate 202. In some embodiments, the upper surface 232t of the gate dielectric layer 232 may be aligned with the upper surface 242t of the gate dielectric layer 242. Alternatively, the upper surfaces 232t and 242t of the gate dielectric layers 232 and 242 may be aligned with (or substantially coplanar with) the upper surface 202t of the substrate 202. In some alternative embodiments, the upper surface 232t of the gate dielectric layer 232 may be aligned with an upper surface 216t of the isolation structure 216.

Still referring to FIG. 4, in some embodiments, a gate electrode 234 and a gate electrode 244 are respectively formed on the gate dielectric layer 232 and the gate dielectric layer 242 filling spaces of the trenches 220 and 222. The gate electrode 234 and the gate electrode 244 may be configured as a high-voltage gate electrode 234 and a sacrificial gate electrode 244, respectively. Accordingly, the gate structure 230 including the gate dielectric layer 232 and the gate electrode 234, and the sacrificial gate structure 240 including the gate dielectric layer 242 and the gate electrode 244, are formed. The gate structure 230 and the sacrificial gate structure 240 are recessed in the substrate 202. The sacrificial gate structure 240 is adjacent to the gate structure 230.

The gate electrodes 234 and 244 are formed through one or more deposition processes (e.g., chemical vapor deposition, physical vapor deposition, etc.). The gate electrodes 234 and 244 may be made of doped polysilicon. Alternatively or additionally, an upper surface of the gate electrode 234 is aligned with the upper surface 232t of the gate dielectric layer 232, and an upper surface of the gate electrode 244 is aligned with the upper surface 242t of the gate dielectric layer 242. In some embodiments, the gate electrodes 234 and 244 have recessed profiles.

Figure 5:
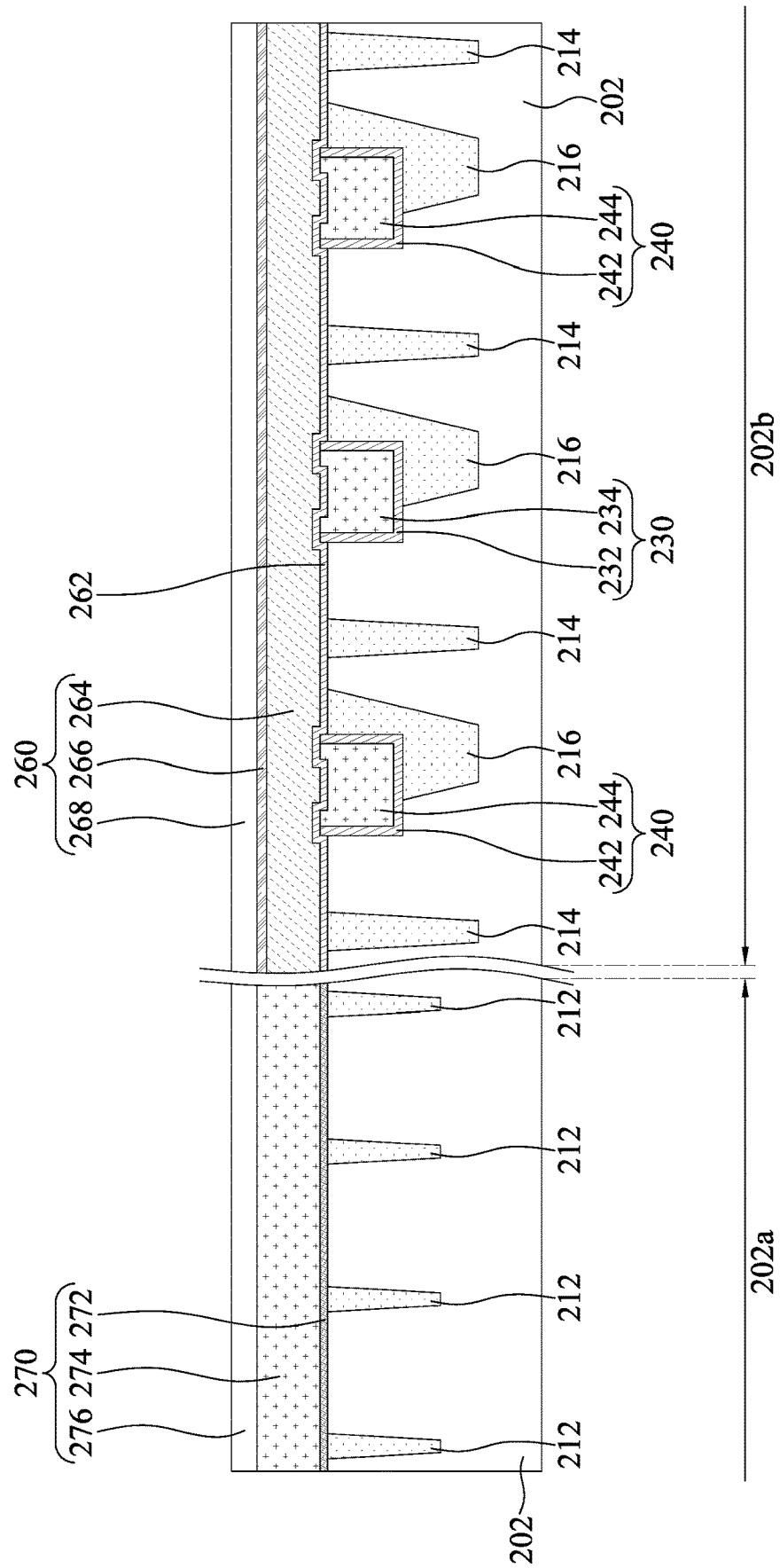

FIG. 5 illustrates a formation of a supporting layer 260 in a second region 202b. Referring to FIG. 5, in some embodiments, the supporting layer 260 is formed over the gate structure 230 and the sacrificial gate structures 240. The supporting layer 260 may include a stack of different materials formed by deposition techniques. For example, the supporting layer 260 may include a stack of CMP protection layers disposed over a sacrificial dielectric layer 262 (e.g., a sacrificial silicon dioxide layer). An example of such stack of CMP protection layers may include a masking layer 264 (e.g., a silicon nitride layer) and a polysilicon liner 266. One or more hard mask layers 268 may be deposited over the stack of CMP protection layers. For example, the hard mask layer 268 may include a dielectric liner and a dielectric layer stacked on the dielectric liner. In some alternative embodiments, the supporting layer 260 is formed to cover the first region 202a and the second region 202b. Additionally, the supporting layer 260 is patterned so as to be removed from the first region 202a by a series of dry etching processes.

FIG. 5 further illustrates a formation of a precursor layer 270 in the first region 202a. The precursor layer 270 may be configured as a low-voltage gate precursor layer or a sacrificial gate precursor layer. In some embodiments, the precursor layer 270 may include a gate dielectric layer 272 (e.g., an interfacial layer (IL), a high-k dielectric layer, and a barrier layer (e.g., titanium nitride) stacked in that order), a gate electrode layer 274, and one or more hard mask layers 276 (e.g., a silicon dioxide layer stacked on a silicon nitride liner, or one or more stacked silicon nitride and silicon dioxide layers). The gate dielectric layer 272 and the gate electrode layer 274 may respectively be configured as a low-voltage gate dielectric layer (or a sacrificial gate dielectric layer) 272 and a low-voltage gate electrode layer (or a sacrificial gate electrode layer) 274.

Figure 6:
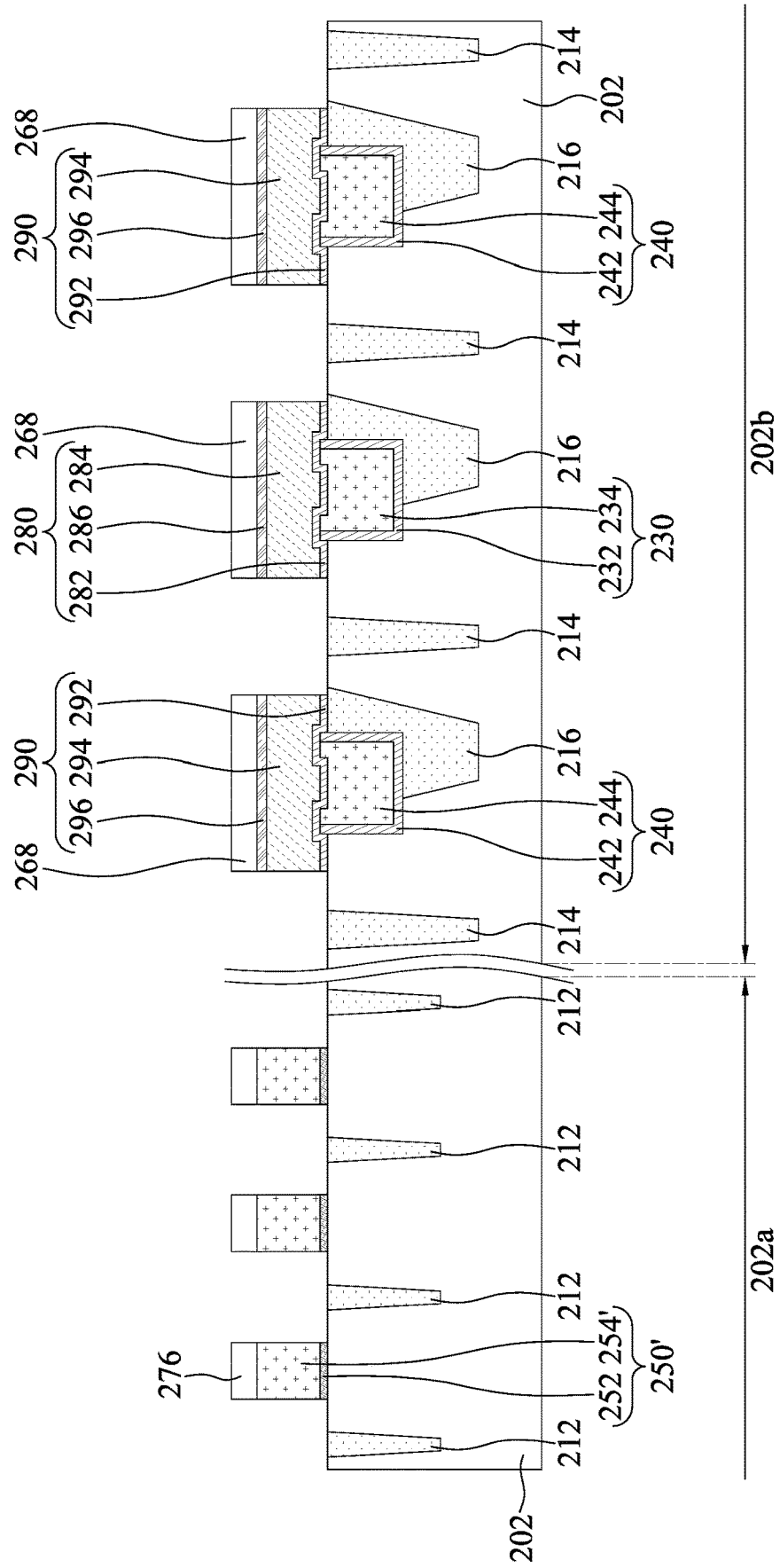

Referring to FIG. 6, in some embodiments, the precursor layer 270 in the first region 202a and the supporting layer 260 in the second region 202b are patterned. In some embodiments, a patterned layer (not shown) is formed over the precursor layer 270 in the first region 202a and the supporting layer 260 in the second region 202b. The patterned layer may be a patterned photoresist layer. In some embodiments, a photoresist layer is formed, and the photoresist layer is then patterned to form openings exposing portions of the precursor layer 270 in the first region 202a, and portions of the supporting layer 260 in the second region 202b. In some embodiments, the hard mask layer 276 of the precursor layer 270 is patterned. The hard mask layer 268 of the supporting layer 260 may be concurrently patterned. After the patterning of the hard mask layers 268 and 276, the patterned layer is then removed.

In some embodiments, the gate dielectric layer 272 and the gate electrode layer 274 of the precursor layer 270 are patterned to form a gate stack 250' including a gate dielectric layer 252 and a gate electrode 254'. The gate stack 250', the gate dielectric layer 252 and the gate electrode 254' may respectively be configured as a low-voltage gate stack 250', a low-voltage gate dielectric layer 252 and a low-voltage gate electrode 254'. In some embodiments, the gate electrode 254' includes polysilicon. The gate dielectric layer 252 may include a high-k gate dielectric layer.

The supporting layer 260 may be concurrently patterned to form discrete portions 280 and 290 respectively overlying the gate electrodes 234 and 244 and the gate dielectric layers 232 and 242. The portions 280 and 290 each include a sacrificial dielectric layer 282/292, a masking layer 284/294 and a polysilicon liner 286/296. The portions 280 and 290 may respectively be hereinafter referred to as a gate masking structure 280 and a sacrificial gate masking structure 290.

Figure 7:
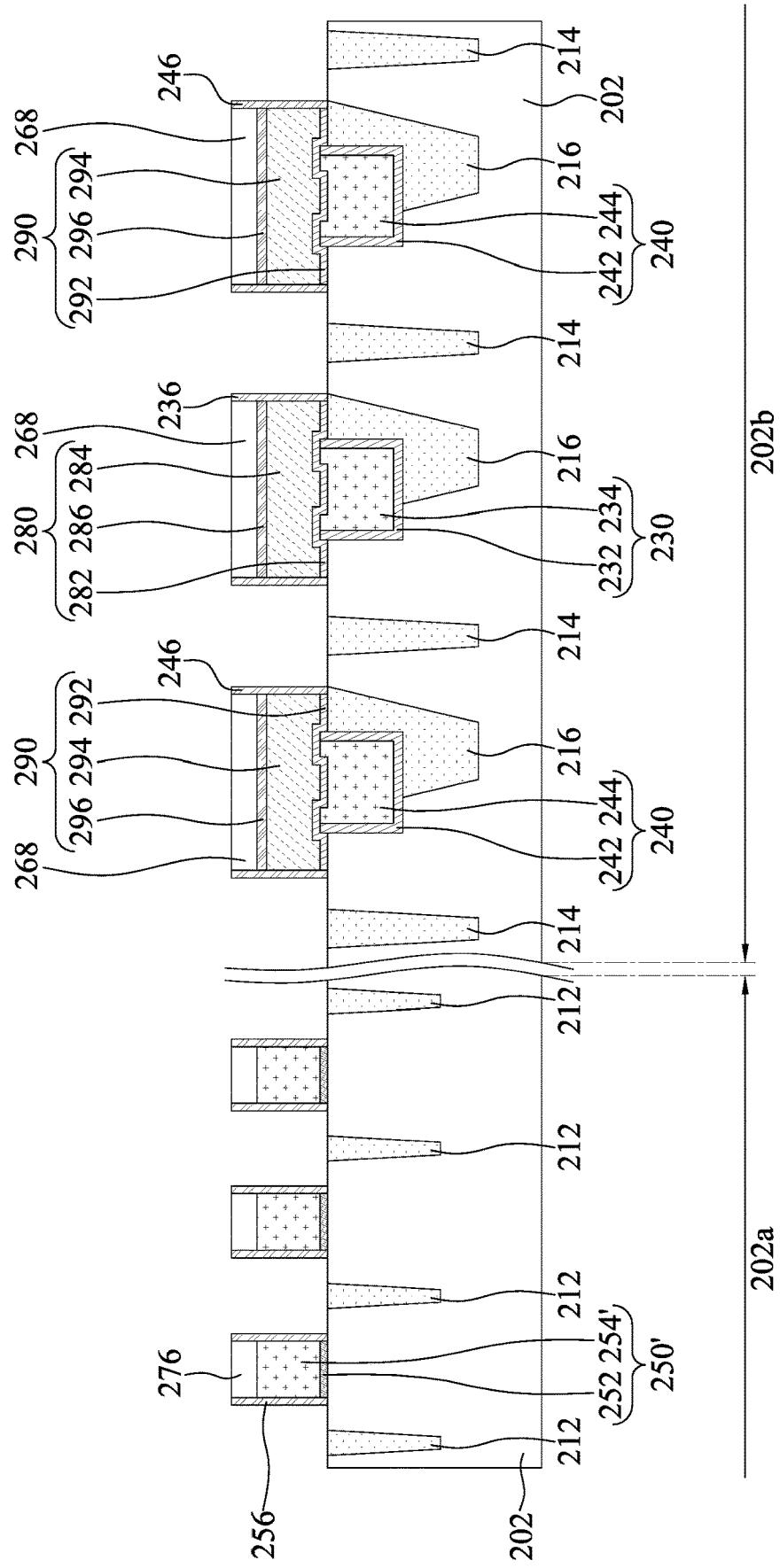

Referring to FIG. 7, in some embodiments, spacers 236, 246 and 256 are formed on sidewalls of the gate masking structure 280, the sacrificial gate masking structure 290, and the gate stack 250', respectively. In some embodiments, each of the spacers 236, 246 and 256 includes a silicon nitride layer. In alternative embodiments, each of the spacers 236, 246 and 256 includes a silicon oxide layer and a silicon nitride layer on the silicon oxide layer. The formation of the spacers 236, 246 and 256 may include depositing blanket dielectric layers, and then performing an anisotropic etching to remove horizontal portions of the blanket dielectric layers. Available deposition methods include plasma-enhanced chemical vapor deposition (PECVD), low-pressure chemical vapor deposition (LPCVD), sub-atmospheric chemical vapor deposition (SACVD), and other deposition methods.

Figure 8:
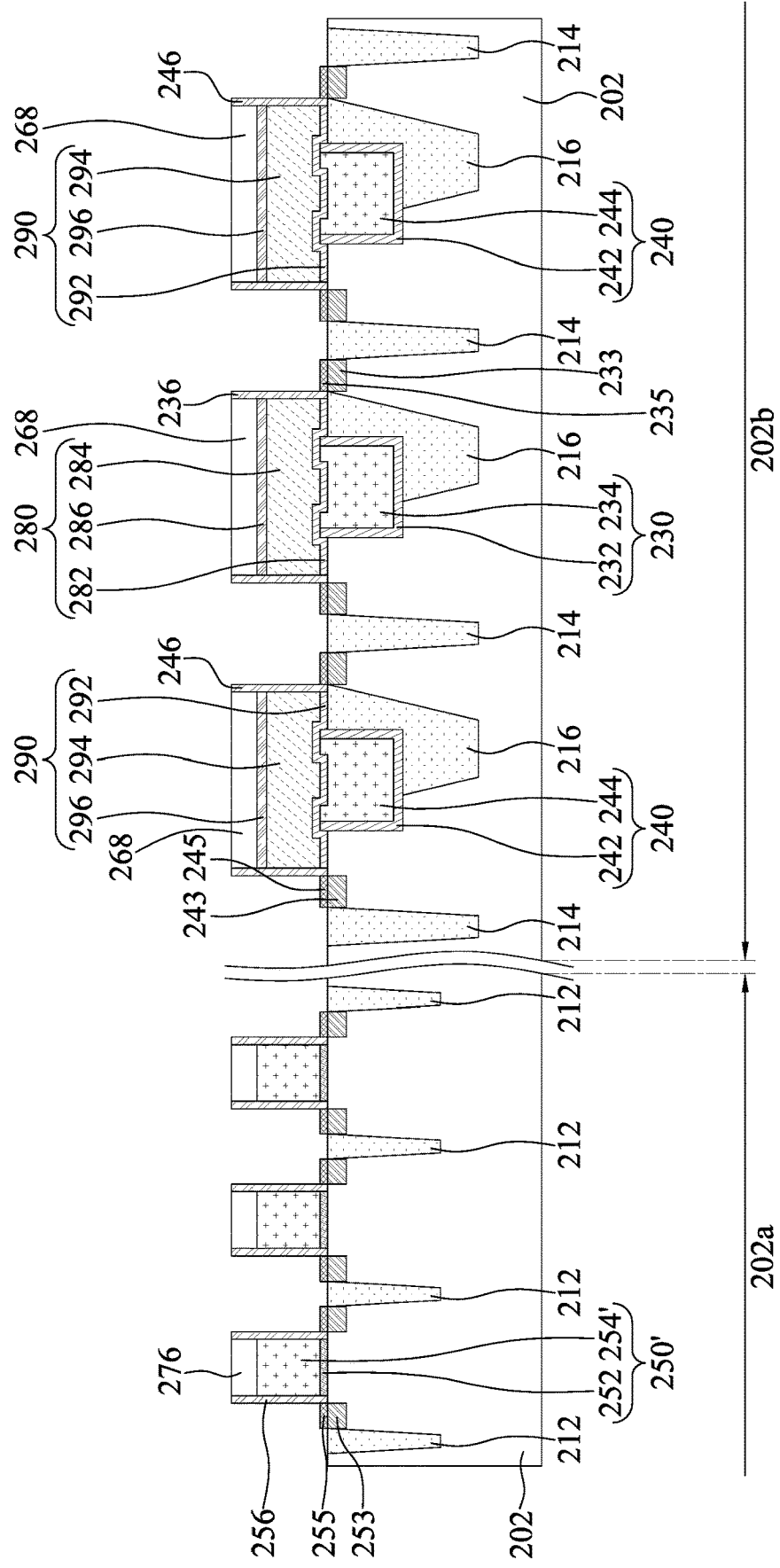

Referring to FIG. 8, in some embodiments, a pair of source/drain structures (or source/drain regions) 253 may be formed in the substrate 202 on opposite sides of the gate stack 250'. The source/drain structures 253 may be strained source/drain (S/D) structures. In some embodiments, the source/drain structures 253 are formed by growing a strained material in an epitaxial (epi) operation. In some embodiments, a lattice constant of the strained material may be different from a lattice constant of the substrate 202. In alternative embodiments, the source/drain structures 253 are formed by epitaxial growth followed by an implantation process. The implantation process may introduce suitable dopants into the source/drain structures 253. Configurations of the source/drain structures 253 depend on different epitaxial techniques, and are not limited herein. In some embodiments, the source/drain structures 253 include Ge, SiGe, InAs, InGaAs, InSb, GaSb, InAlP, InP, or a combination thereof.

In some embodiments, a pair of source/drain regions 233 may be formed in the substrate 202 on opposite sides of the gate masking structure 280. Additionally, a pair of source/drain regions 243 may be formed in the substrate 202 on opposite sides of the sacrificial gate masking structure 290. In some embodiments, the source/drain regions 233 and 243 may be formed in a single formation process. The source/drain regions 233 and 243 may be formed simultaneously in a single implantation process. In some embodiments, the source/drain regions 233 and 243 are heavily doped. In some embodiments, a photoresist (not shown) is formed over the substrate 202 to define locations of the source/drain regions 233 and 243. The source/drain regions 233 and 243 may have edges aligned with edges of the spacers 236 and 246, respectively. The source/drain regions 233 and 243 may be asymmetrical with respect to the gate electrodes 234 and 244.

Still referring to FIG. 8, in some embodiments, silicide layers (which are sometimes referred to as silicide regions) 235, 245 and 255 may respectively be formed on exposed surfaces of the source/drain regions 233, 243 and the source/drain structures 253. The formation process may include forming a resist protective oxide (RPO) over portions of the substrate 202 that are not protected by the spacers 236, 246 and 256. The RPO may function as a silicide blocking layer during the formation of the silicide layers 235, 245 and 255. The silicide layers 235, 245 and 255 may be formed using silicidation such as self-aligned silicide (salicide). The silicide layers 235, 245 and 255 may be formed in a self-aligned manner on various features, such as the source/drain regions 233, 243 and the source/drain structures 253, to reduce contact resistance. The silicide layers 235, 245 and 255 may have edges aligned with edges of the spacers 236, 246 and 256, respectively.

Figure 9:
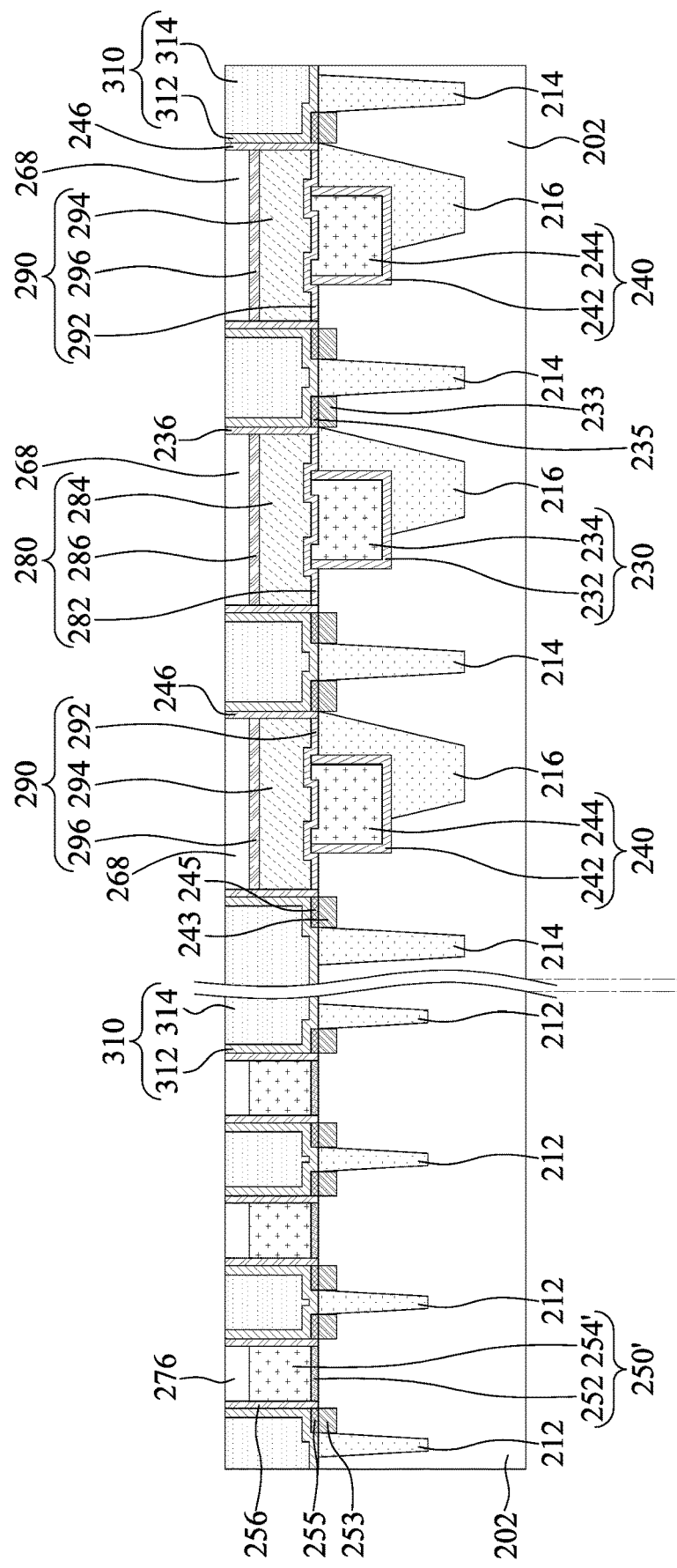

Referring to FIG. 9, in some embodiments, a dielectric layer 310 is formed over the substrate 202. The dielectric layer 310 is formed surrounding the gate stack 250', the gate masking structures 280 and the sacrificial gate masking structures 290. In some embodiments, the dielectric layer 310 may include an etch-stop layer (e.g., a contact etch stop layer (CESL)) 312 and various dielectric layers (e.g., an inter-layer dielectric (ILD) layer 314) formed over the substrate 202. In some embodiments, the CESL 312 includes a SiN layer, a SiCN layer, a SiON layer, and/or other suitable materials. In some embodiments, the ILD layer 314 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 10:
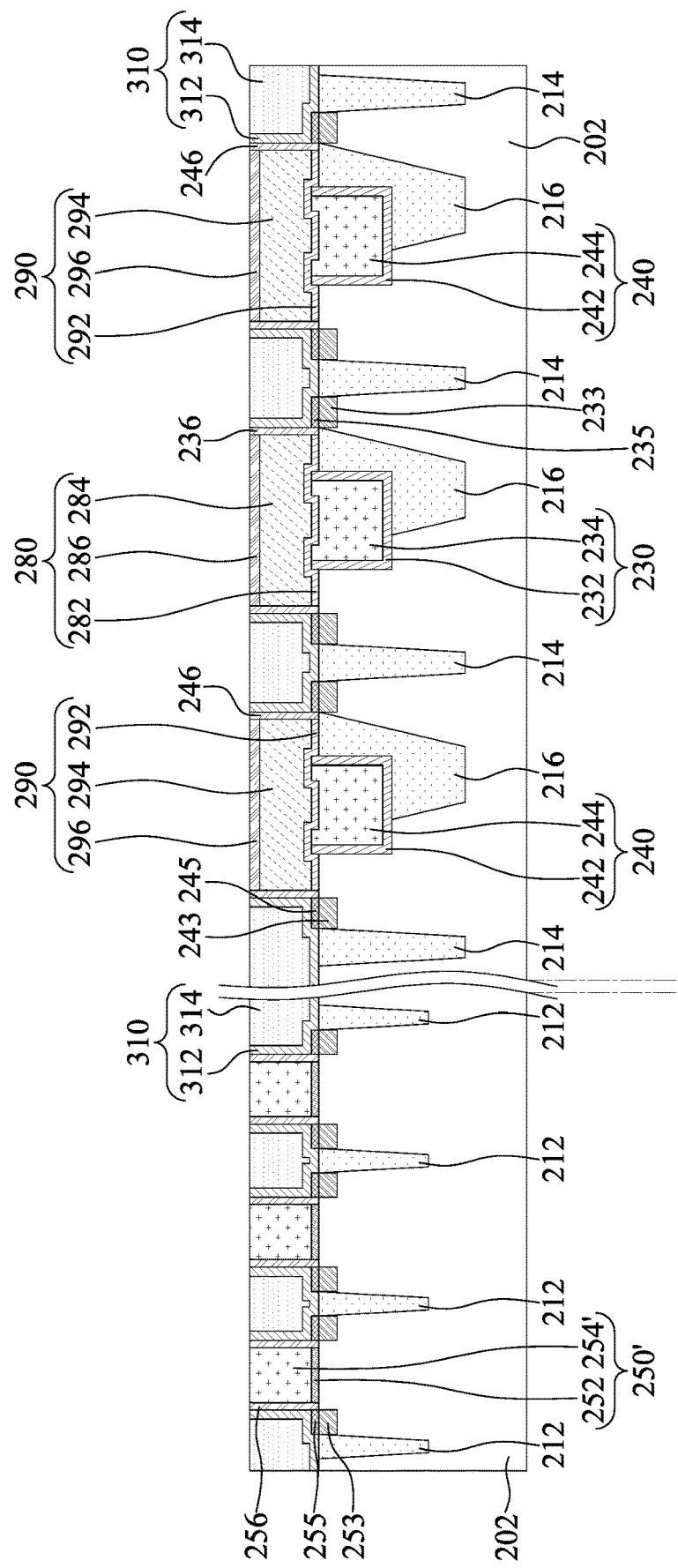

Referring to FIG. 10, in some embodiments, the hard mask layers 276 and 268 are removed. In some embodiments, after the CESL 312 and the ILD layer 314 are deposited, a planarization process may be performed to form the dielectric layer 310 and remove the hard mask layers 276 and 268. In some embodiments, the gate electrode 254' in the first region 202a and the polysilicon liners 286/296 in the second region 202b are respectively configured as an etch stop layer during the planarization process. In some embodiments, an upper surface of the polysilicon liner 286/296 is substantially aligned with (or substantially coplanar with) an upper surface of the gate electrode 254'. In some embodiments, an upper surface of the dielectric layer 310 is aligned with the upper surfaces of the gate electrode 254'. Additionally, the upper surface of the dielectric layer 310 is aligned with the upper surfaces of the polysilicon liners 286 and 296.

Figure 11:
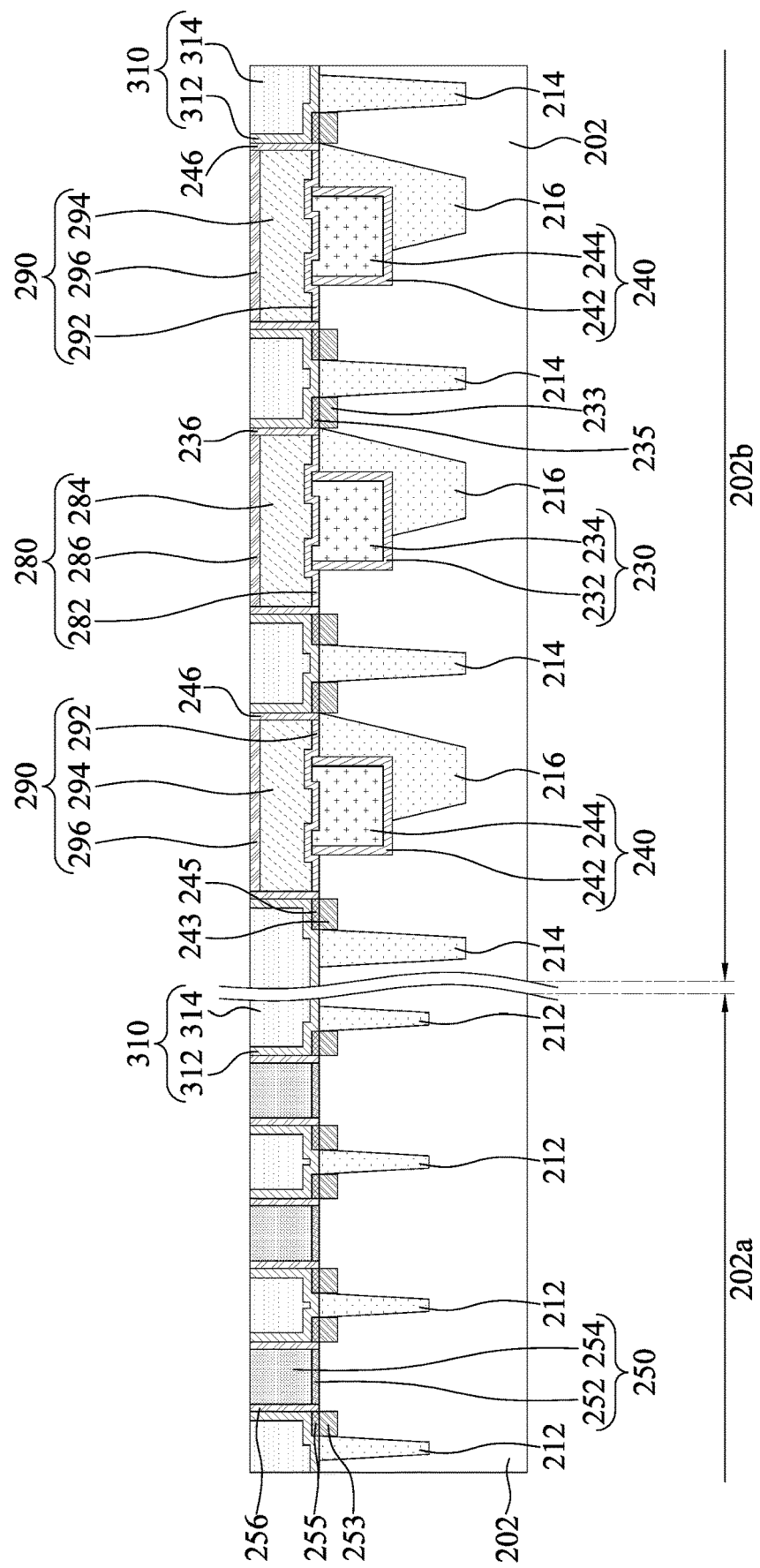

Referring to FIG. 11, in some embodiments, a replacement gate process may be subsequently performed by replacing the gate electrode 254' with metal materials to form a gate electrode 254. A gate structure 250 including the gate dielectric layer 252 and the gate electrode 254 is thus formed. A series of deposition and etching processes may be performed to form different metal compositions for different devices or different components of the same devices, in order to achieve desired work functions. In some embodiments, the gate electrode 254 may be made of metal or a metal alloy. In some embodiments, the gate electrode 254 may include a core metal layer such as copper (Cu), tungsten (W), aluminum (Al), or an alloy thereof, and a barrier layer such as titanium (Ti), tantalum (Ta), zirconium (Zr), or an alloy thereof. The gate electrode 254 may be configured as a low-voltage gate electrode 254. In some alternative embodiments, another gate dielectric layer may be formed to cover bottom and sidewall surfaces of the gate electrode 254. In such embodiments, the gate dielectric layer includes a high-k dielectric material with a dielectric constant greater than 3.9. Examples of the gate dielectric layer include hafnium oxide (HfO), hafnium silicon oxide (HfSiO), hafnium aluminum oxide (HfAlO), and hafnium tantalum oxide (HfTaO).

Figure 12:
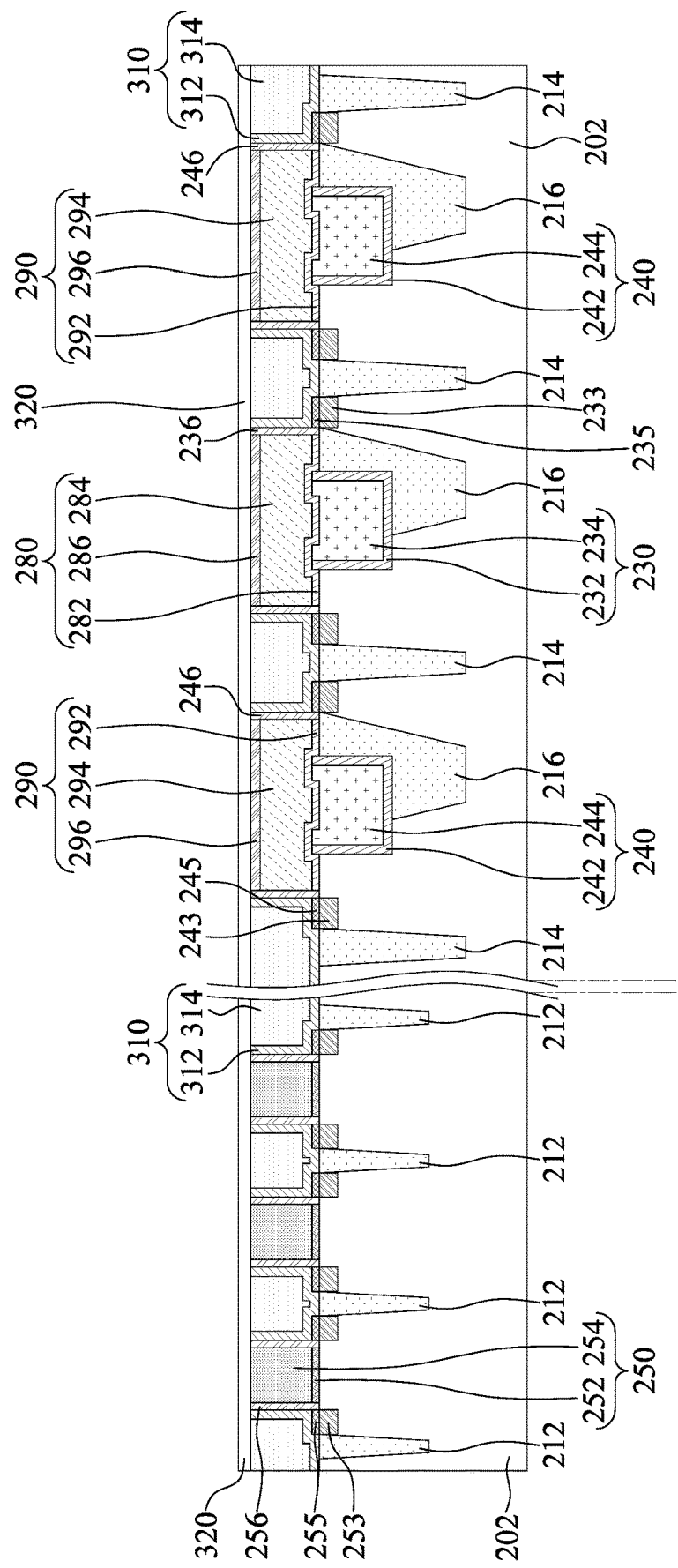

Referring to FIG. 12, in some embodiments, a buffer layer 320 may be formed. In some embodiments, the buffer layer 320 is formed to cover the first region 202a and the second region 202b. The buffer layer 320 may be an oxide layer, such as a silicon dioxide layer, but other suitable dielectric materials are also applicable. Alternatively, the buffer layer 320 may include a stack of different materials formed by deposition techniques. The buffer layer 320 may be configured to protect the gate structures 250 during subsequent operations.

Figure 13:
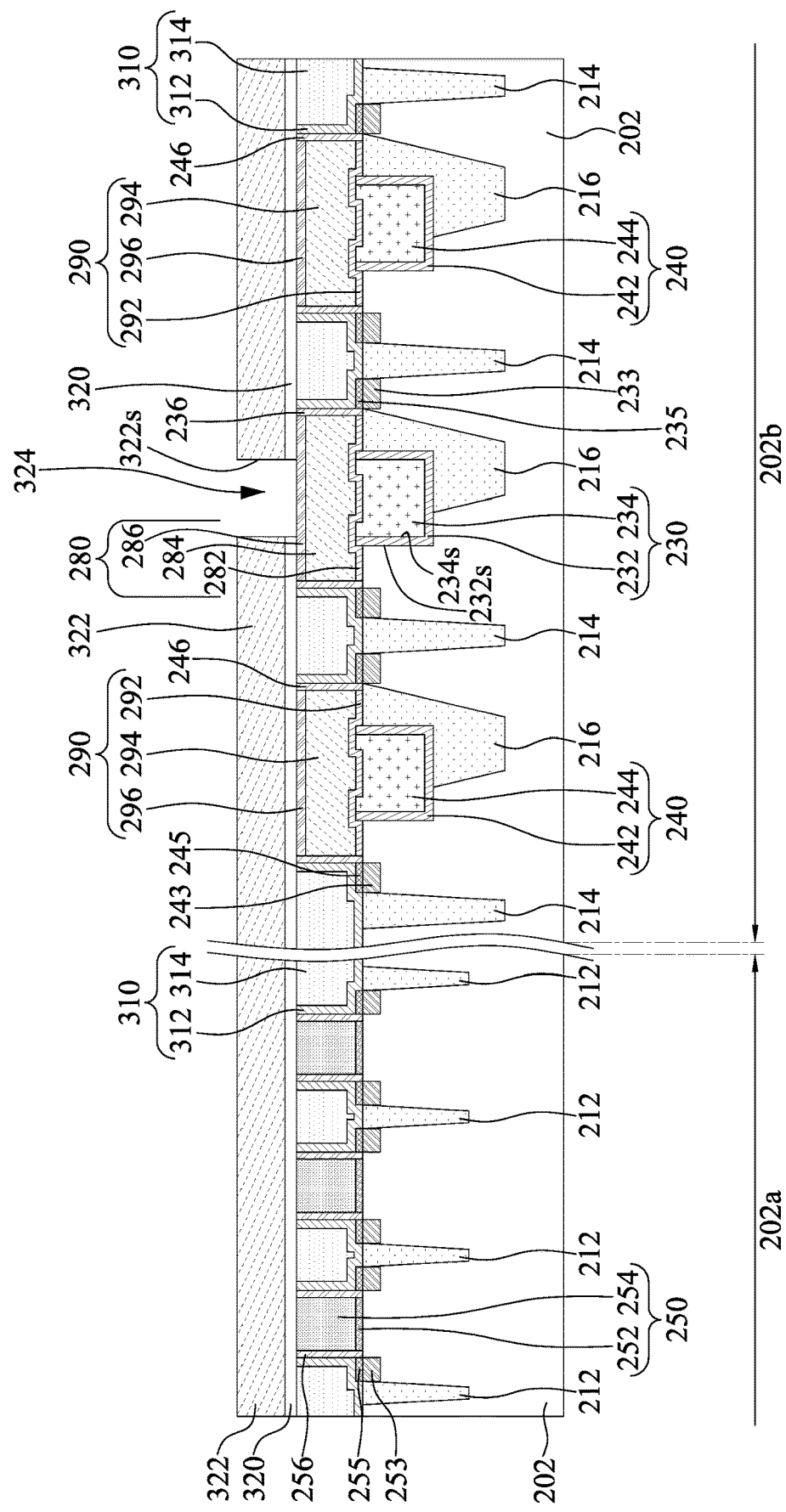
Figure 14:
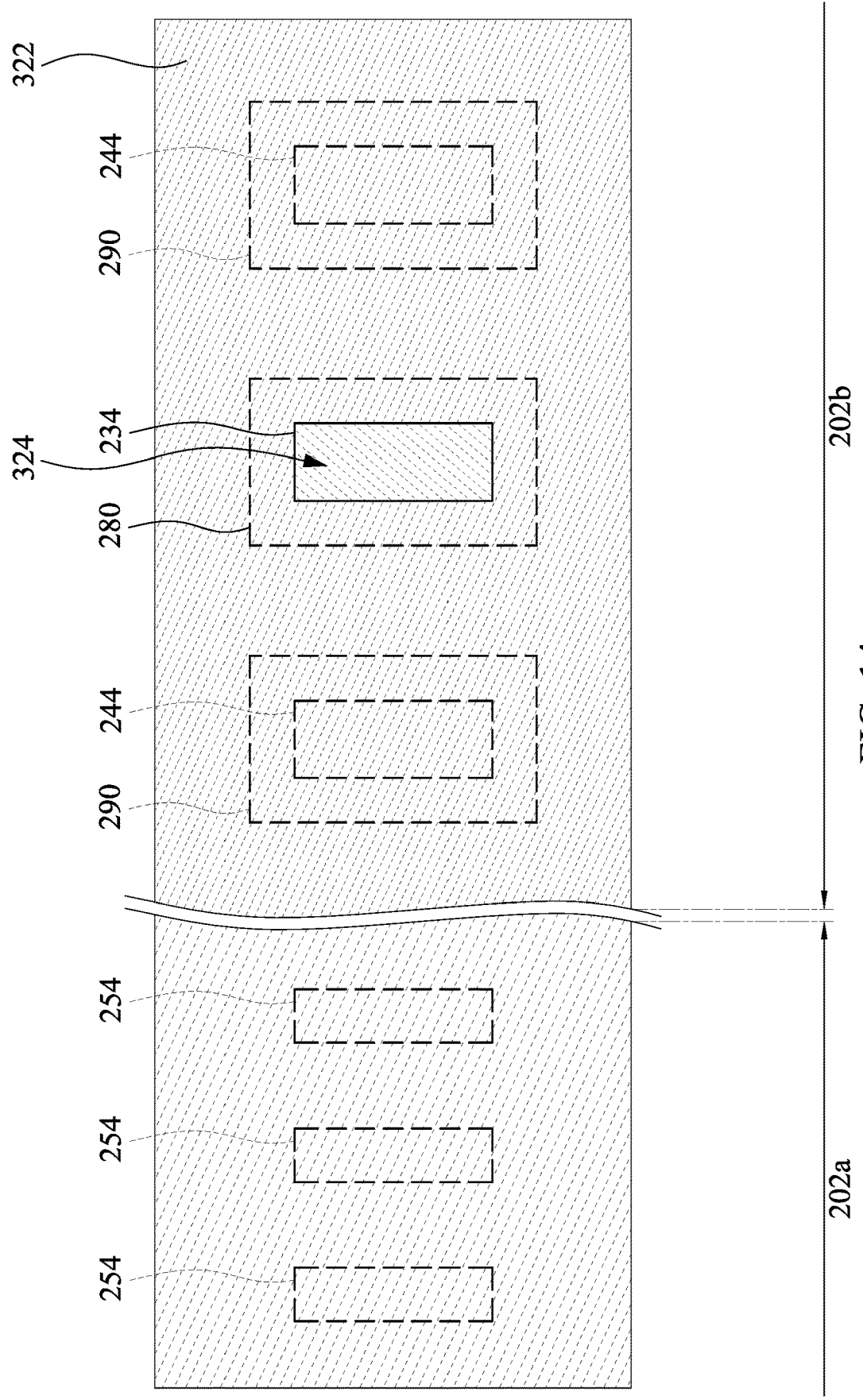
FIGS. 14 and 17 are top views illustrating a semiconductor structure at different fabrication stages constructed according to aspects of one or more embodiments of the present disclosure.

Referring to FIG. 13, in some embodiments, a patterned layer 322 is formed. The respective step is shown as operation 106 of the method 100 in FIG. 1. The patterned layer 322 may be formed over the gate structures 250 in the first region 202a and the sacrificial gate masking structure 290 in the second region 202b. Additionally, the patterned layer 322 may further cover a portion of the gate masking structure 280 in the second region 202b. In some embodiments, a portion of the gate masking structure 280 (e.g., a portion of the polysilicon liner 286) is exposed through the patterned layer 322. In some embodiments, the sacrificial gate masking structure 290 is entirely covered by the patterned layer 322.

In some embodiments, the patterned layer 322 may be a patterned photoresist layer. In some embodiments, a photoresist layer is formed over the first region 202a and the second region 202b, and the photoresist layer is then patterned to form openings exposing portions of the buffer layer 320 overlying the gate masking structure 280 in the second region 202b. In some embodiments, portions of the buffer layer 320 overlying the gate masking structure 280 are removed, thereby forming openings 324 exposing portions of the gate masking structure 280 in the second region 202b.

In some embodiments, the patterned layer 322 has a sidewall 322s aligned with a sidewall (or an edge) 234s of the gate electrode 234. Alternatively, the sidewall 322s of the patterned layer 322 is aligned with a sidewall (or an edge) 232s of the gate dielectric layer 232. In some alternative embodiments, the sidewall 322s of the patterned layer 322 is aligned with a centerline between the sidewall 234s of the gate electrode 234 and the sidewall 232s of the gate dielectric layer 232.

Referring to FIG. 14, FIG. 14 illustrates the patterned layer 322 along with the gate electrodes 234, 244 and 254, the gate masking structure 280 and the sacrificial gate masking structures 290 from a top-view perspective. As illustrated in FIG. 14, the patterned layer 322 includes the opening 324 overlapping an area of the gate electrode 234. In some embodiments, a dimension of the opening 324 is substantially equal to a dimension of the area of the gate electrode 234. Alternatively, the dimension of the opening 324 is greater than the dimension of the area of the gate electrode 234.

Figure 15:
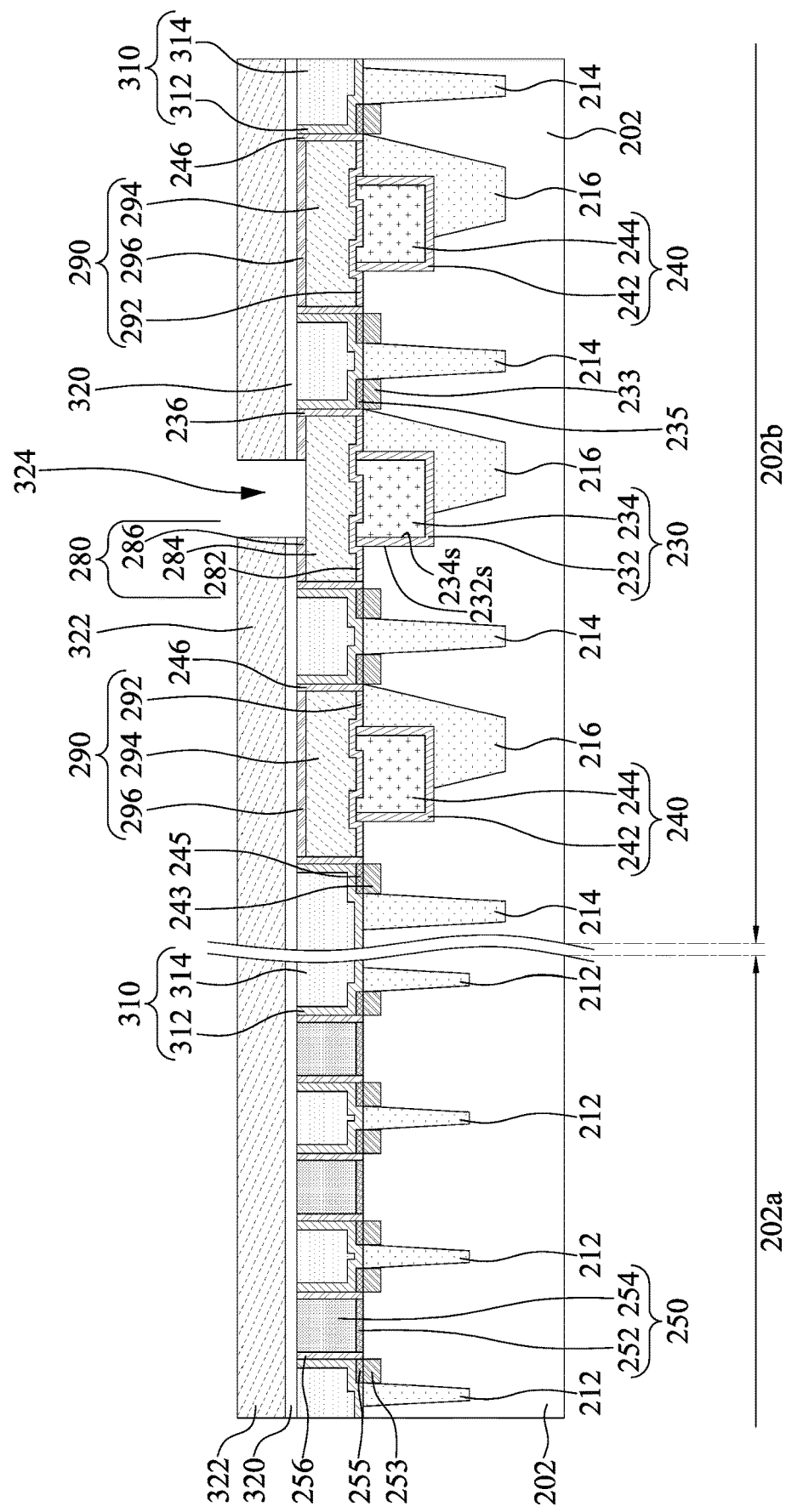

Referring to FIG. 15, an exposed portion of the polysilicon liner 286 is removed. The respective step is shown as operation 108 of the method 100 in FIG. 1. The exposed portion of the polysilicon liner 286 may be removed by one or more etching processes. The etching processes may include a dry etch or a wet etch. Only the exposed portion of the polysilicon liner 286 may be removed in the etching processes, while the masking layer 284 remains intact after the removal of the exposed portion of the polysilicon liner 286. After the removal of the portion of the polysilicon liner 286, the patterned layer 322 is then removed.

Figure 16:
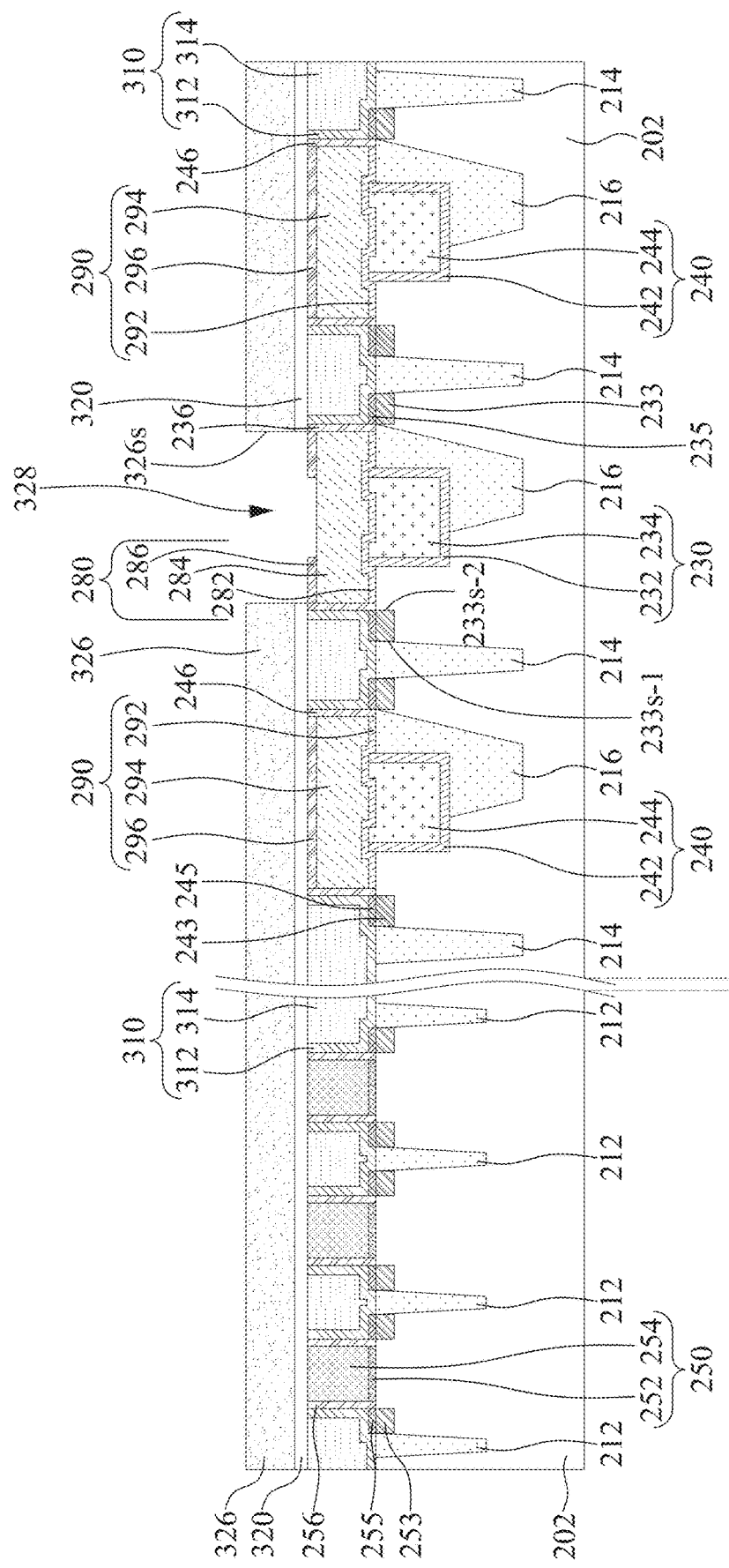
Figure 17:
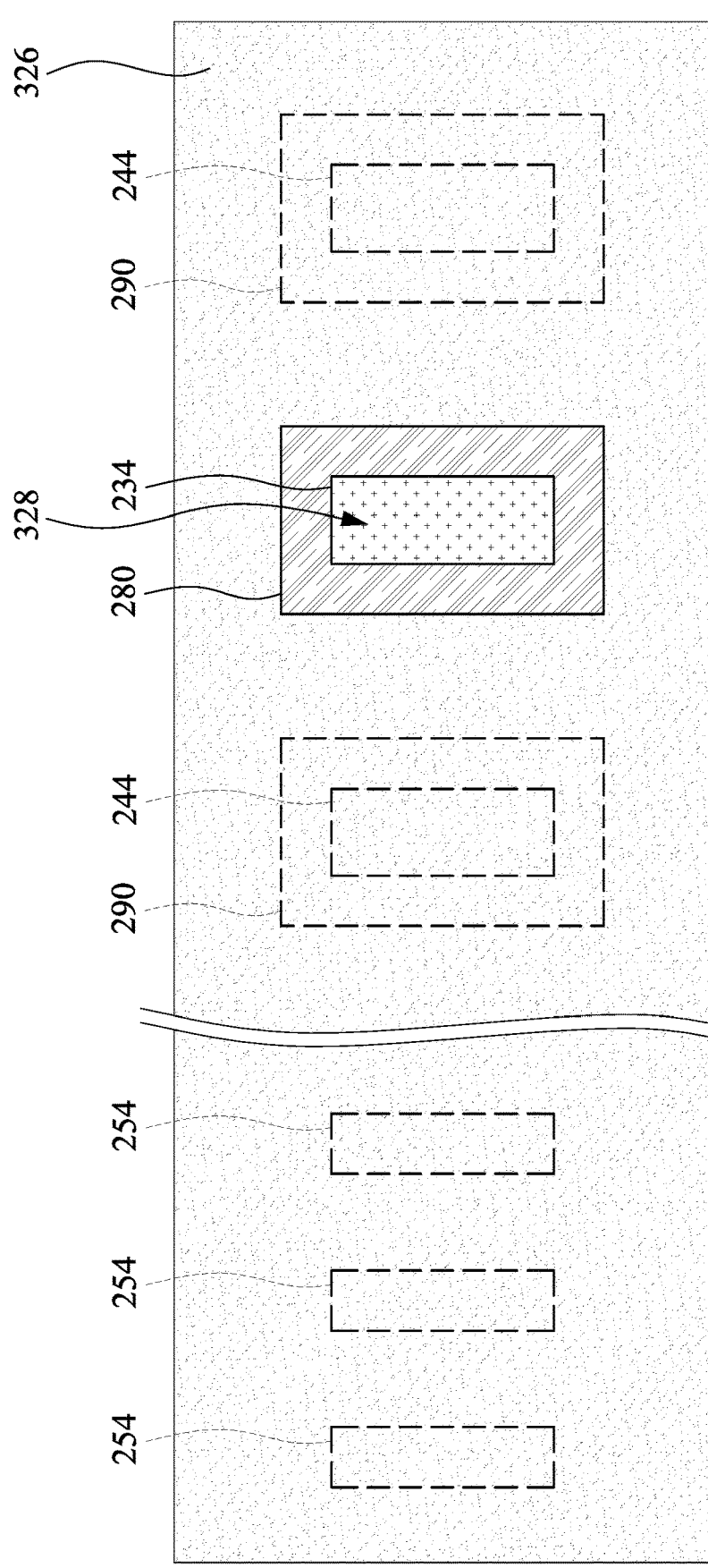

Referring to FIG. 16, in some embodiments, a patterned layer 326 is formed. The patterned layer 326 may be formed over the gate structures 250 in the first region 202a and the sacrificial gate masking structure 290 in the second region 202b. The patterned layer 326 may have an opening 328 exposing the gate masking structure 280 in the second region 202b. In some embodiments, the gate masking structure 280 is entirely exposed through the patterned layer 326.

In some embodiments, the patterned layer 326 may be a patterned photoresist layer. In some embodiments, a photoresist layer is formed over the first region 202a and the second region 202b, and the photoresist layer is then patterned to form openings exposing portions of the buffer layer 320 overlying the gate masking structure 280 in the second region 202b. In some embodiments, the portions of the buffer layer 320 overlying the gate masking structure 280 are removed, thereby forming openings exposing the gate masking structure 280 in the second region 202b.

In some embodiments, the patterned layer 326 has a sidewall 326s aligned with an edge of the spacer 236 proximal to the gate masking structure 280. Alternatively, the sidewall 326s is aligned with an edge of the spacer 236 distal to the gate masking structure 280. In alternative embodiments, the sidewall 326s is aligned with a sidewall (or an edge) 233s-1 of the source/drain region 233 distal to the gate electrode 234. Alternatively, the sidewall 326s of the patterned layer 326 is aligned with a sidewall (or an edge) 233s-2 of the source/drain region 233 proximal to the gate electrode 234. In some alternative embodiments, the sidewall 326s of the patterned layer 326 is aligned with a centerline between the sidewall 233s-1 and the sidewall 233s-2 of the source/drain region 233.

Referring to FIG. 17, FIG. 17 illustrates the patterned layer 326 along with the gate electrodes 234, 244 and 254, the gate masking structure 280 and the sacrificial gate masking structures 290 from a top-view perspective. As illustrated in FIG. 17, the patterned layer 326 includes the opening 328 overlapping an area of the gate masking structure 280. In some embodiments, a dimension of the opening 328 is substantially equal to a dimension of the area of the gate masking structure 280. Alternatively, the dimension of the opening 328 is greater than the dimension of the area of the gate masking structure 280. In some embodiments, a dimension of the opening 328 is greater than a dimension of the opening 324. Alternatively stated, the exposed portion of the gate masking structure 280 exposed through the patterned layer 326 is greater than the exposed portion of the gate masking structure 280 exposed through the patterned layer 322.

Figure 18:
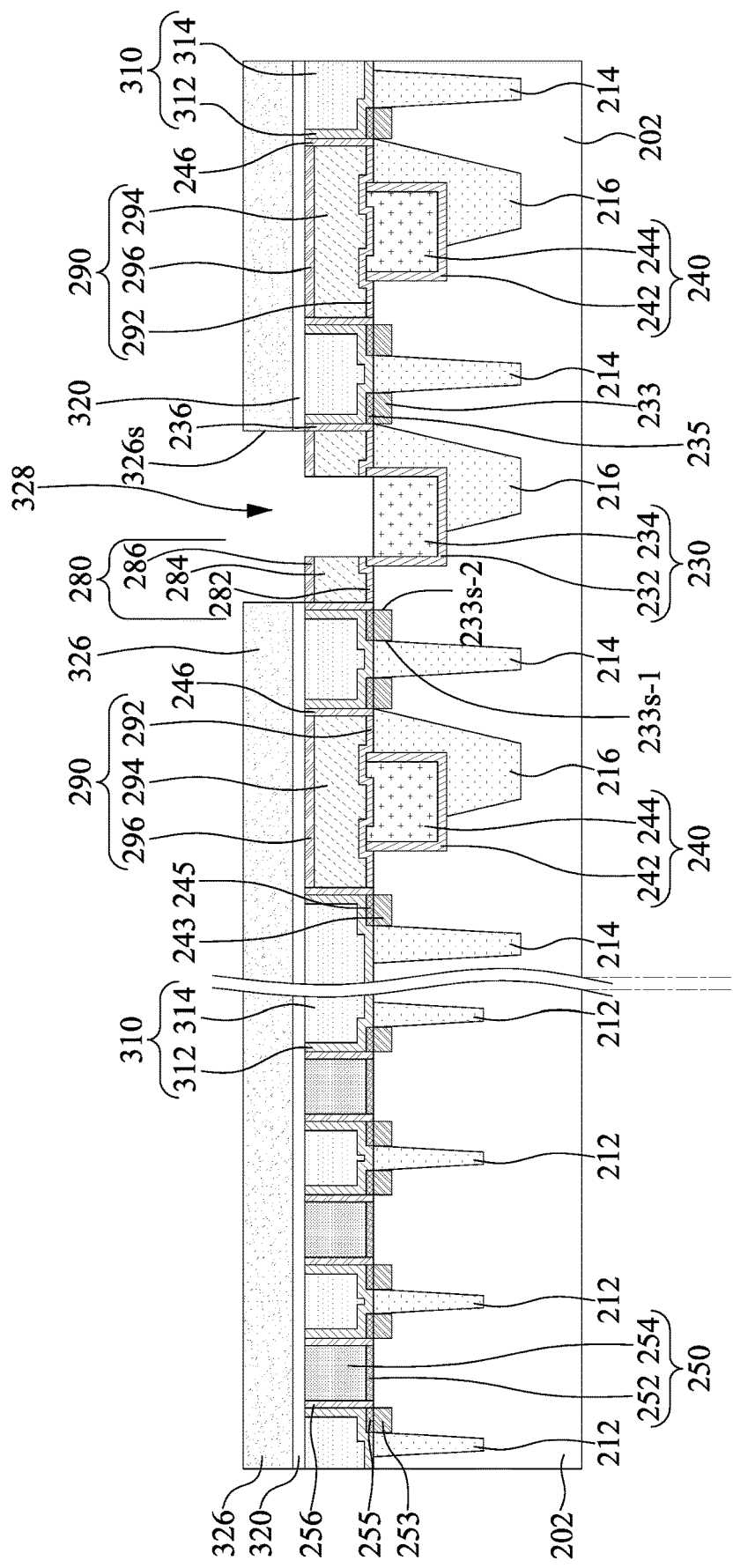

Referring to FIG. 18, in some embodiments, an exposed portion of the masking layer 284 is removed. The exposed portion of the masking layer 284 may be removed by one or more etching processes. The etching processes may include a dry etch or a wet etch. In some embodiments, the remaining portions of the polysilicon liner 286 are configured as an etch stop layer during the etching process. Alternatively stated, only the exposed portion of the masking layer 284 (exposed through the polysilicon liner 286) may be removed in the etching processes, while other portions of the masking layer 284 underlying the polysilicon liner 286 remain intact. After the removal of the portion of the masking layer 284, the gate electrode 234 is exposed and the patterned layer 326 is then removed. In some embodiments, the gate masking structure 280 is disposed over the substrate 202 at a peripheral region of the gate electrode 234. In some embodiments, an upper surface of the gate masking structure 280 is aligned with an upper surface of the sacrificial gate masking structure 290.

Figure 19:
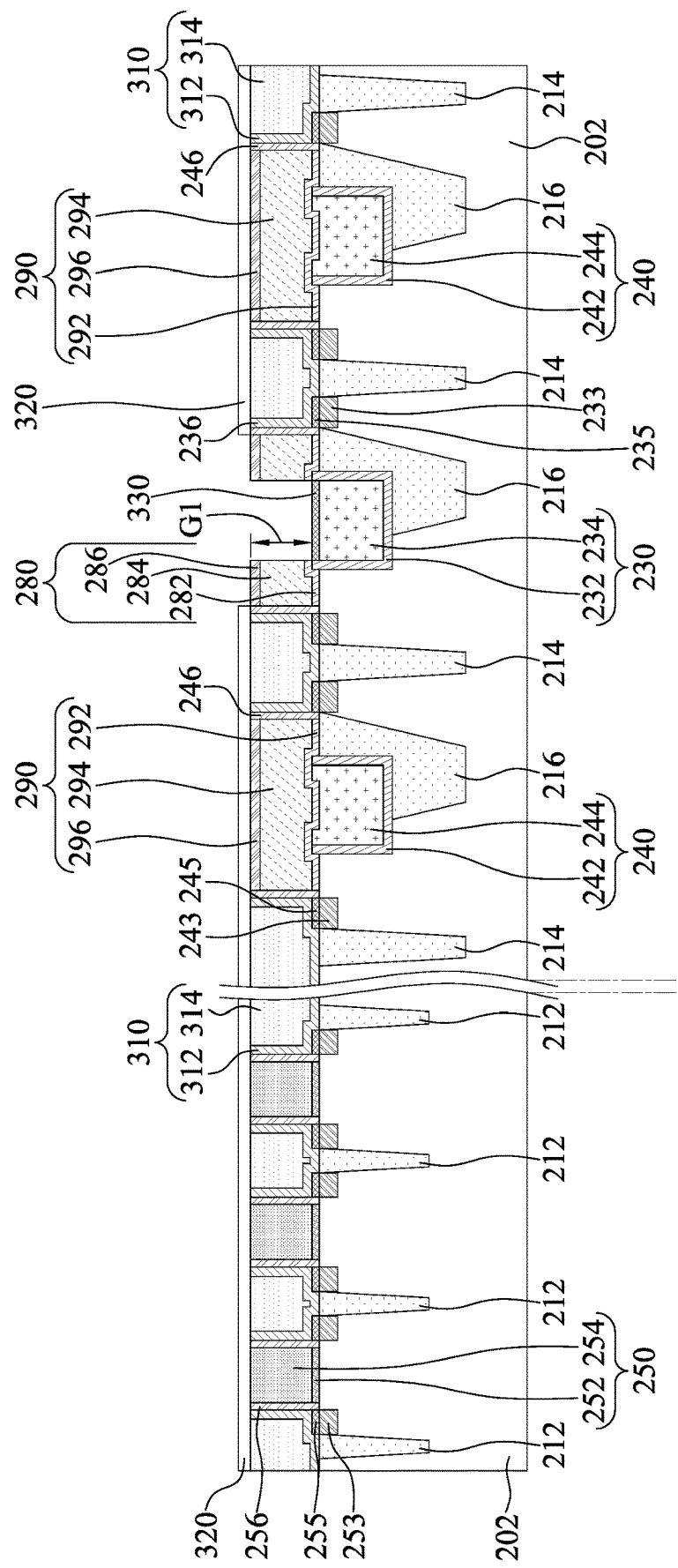

Referring to FIG. 19, in some embodiments, one or more silicide layers 330 may be formed on an exposed surface of the gate electrode 234. The respective step is shown as operation 110 of the method 100 in FIG. 1. In some embodiments, the silicide layer 330 is formed using silicidation such as self-aligned silicide (salicide). The silicide layer 330 may be formed in a self-aligned manner on the gate electrode 234 to reduce contact resistance. The silicide layer 330 may have edges aligned with edges of the gate masking structure 280. In some embodiments, a topography gap G1 between an upper surface of the buffer layer 320 and an upper surface of the silicide layer 330 is substantially in a range from about 300 angstroms (Å) to about 600 Å. After the formation of the silicide layer 330, the buffer layer 320 may be removed.

The proposed embodiments of a semiconductor structure and forming method thereof provide advantages. By forming the patterned layer 322, only a portion of the gate masking structure 280 overlapping the gate electrode 234 is removed. An upper surface of the sacrificial gate structure 240 is entirely covered by the sacrificial gate masking structure 290. Furthermore, the upper surface of the sacrificial gate structure 240 entirely contacts a bottom surface of the sacrificial gate masking structure 290. The upper surfaces of the sacrificial gate masking structures 290 in the second region 202b are aligned with the upper surfaces of the gate structures 250 in the first region 202a (i.e., there are substantially zero topography gaps). Moreover, most of the second region 202b is covered or protected by the gate masking structure 280, the sacrificial gate masking structures 290 and the dielectric layer 310. Accordingly, topography gaps between the first region 202a and the second region 202b may be significantly reduced, and fewer non-correctable focus errors may be expected.

Figure 20:
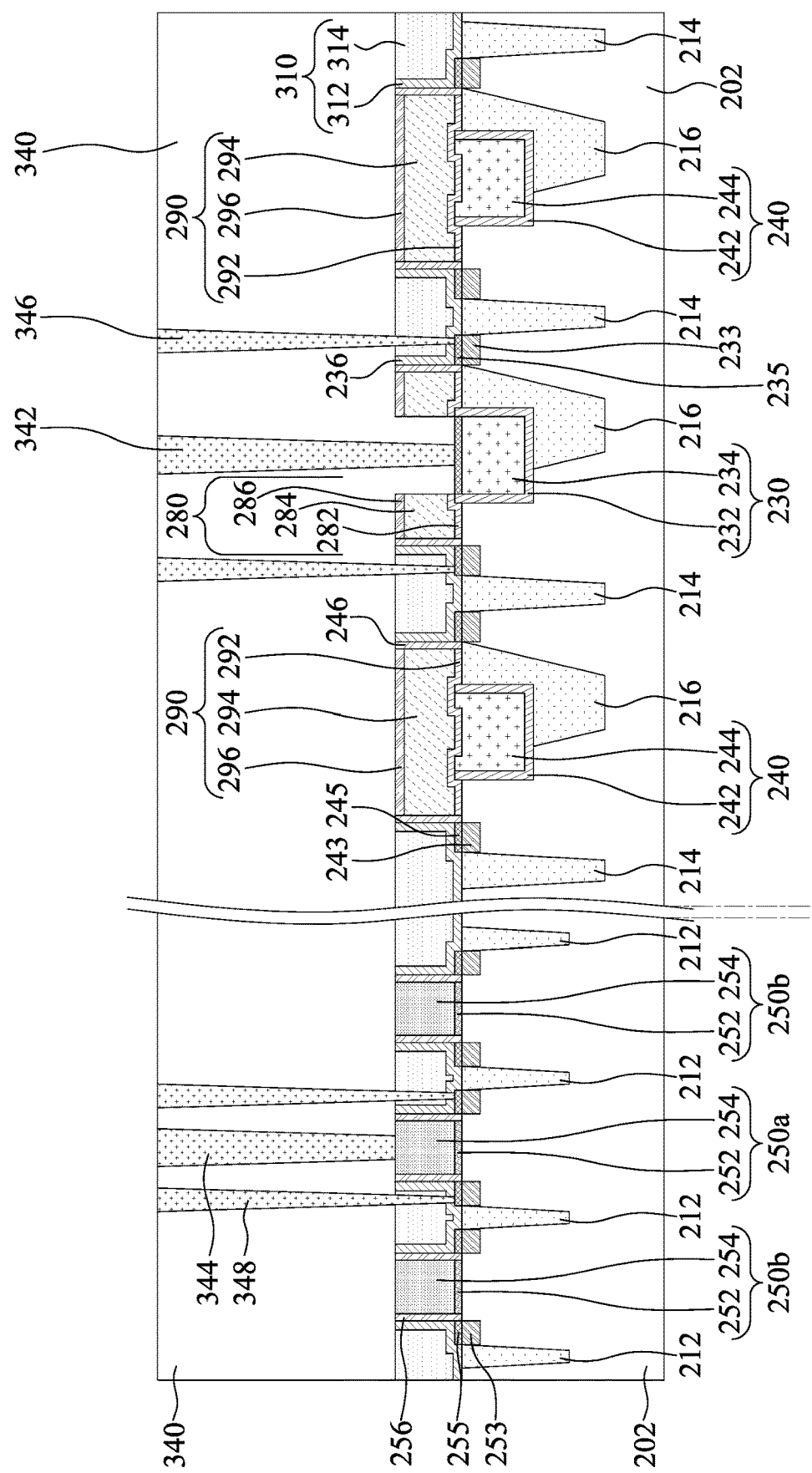

Referring to FIG. 20, in some embodiments, a dielectric layer 340 is formed over the dielectric layer 310. The ILD layer 314 and the dielectric layer 340 may include same or different low-k dielectric layers, ultra-low-k dielectric layers, extreme low-k dielectric layers, and/or silicon dioxide layers. In some embodiments, the dielectric layer 310 and the dielectric layer 340 are together referred to as a dielectric structure. In some embodiments, the dielectric layer 340 may also fill the openings previously formed and may cover the gate electrode 234. In some embodiments, at least a portion of the dielectric layer 340 is disposed within the gate masking structure 280. Alternatively stated, the gate masking structure 280 laterally surrounds a portion of the dielectric structure (e.g, 310 and 340). In some embodiments, the sacrificial gate structure 240 is separated from the dielectric structure (e.g, 310 and 340) by the sacrificial gate masking structure 290.

In some embodiments, contacting structures 342 and 344 are formed and penetrate through the dielectric layer 340 to reach upper surfaces of the gate electrode 234 and the gate electrode 254. Alternatively or additionally, contacting structures 346 and 348 may extend through the dielectric layers 310 and 340 and may be coupled to the source/drain structures 253 and the source/drain regions 233. The contacting structures 342, 344, 346 and 348 may be formed by selectively etching the dielectric layer 310 and/or the dielectric layer 340 to form openings (e.g., with a patterned photoresist mask in place), and by subsequently depositing a conductive material within the openings. In some embodiments, the conductive material may include tungsten (W), copper (Cu), aluminum (Al) or titanium nitride (TiN), for example. In some embodiments, the contacting structure 342 is spaced apart from the gate masking structure 280. In some embodiments, the silicide layer 330 electrically connects the gate structure 230 to the contacting structure 342.

Different transistor devices in different regions are thus formed. A transistor device 250a including the gate dielectric layer 252 and the gate electrode 254 is disposed in the first region 202a. A transistor device 230 (or the gate structure) including the gate dielectric layer 232 and the gate electrode 234 is disposed in the second region 202b. The transistor device 230 is configured to operate at an operation voltage greater than that of the transistor device 250a. The gate electrode 234 may have a gate length and a gate width greater than those of the gate electrode 254. In some embodiments, the gate electrode 254 is a metal gate, and the gate electrodes 234 and 244 are polysilicon gates. The gate dielectric layer 232 may have a thickness greater than that of the gate dielectric layer 252. In some embodiments, the thickness of the gate dielectric layer 232 is about 2 to 5 times the thickness of the gate dielectric layer 252, such that the gate dielectric layer 232 may support a greater breakdown voltage.

Figure 21:
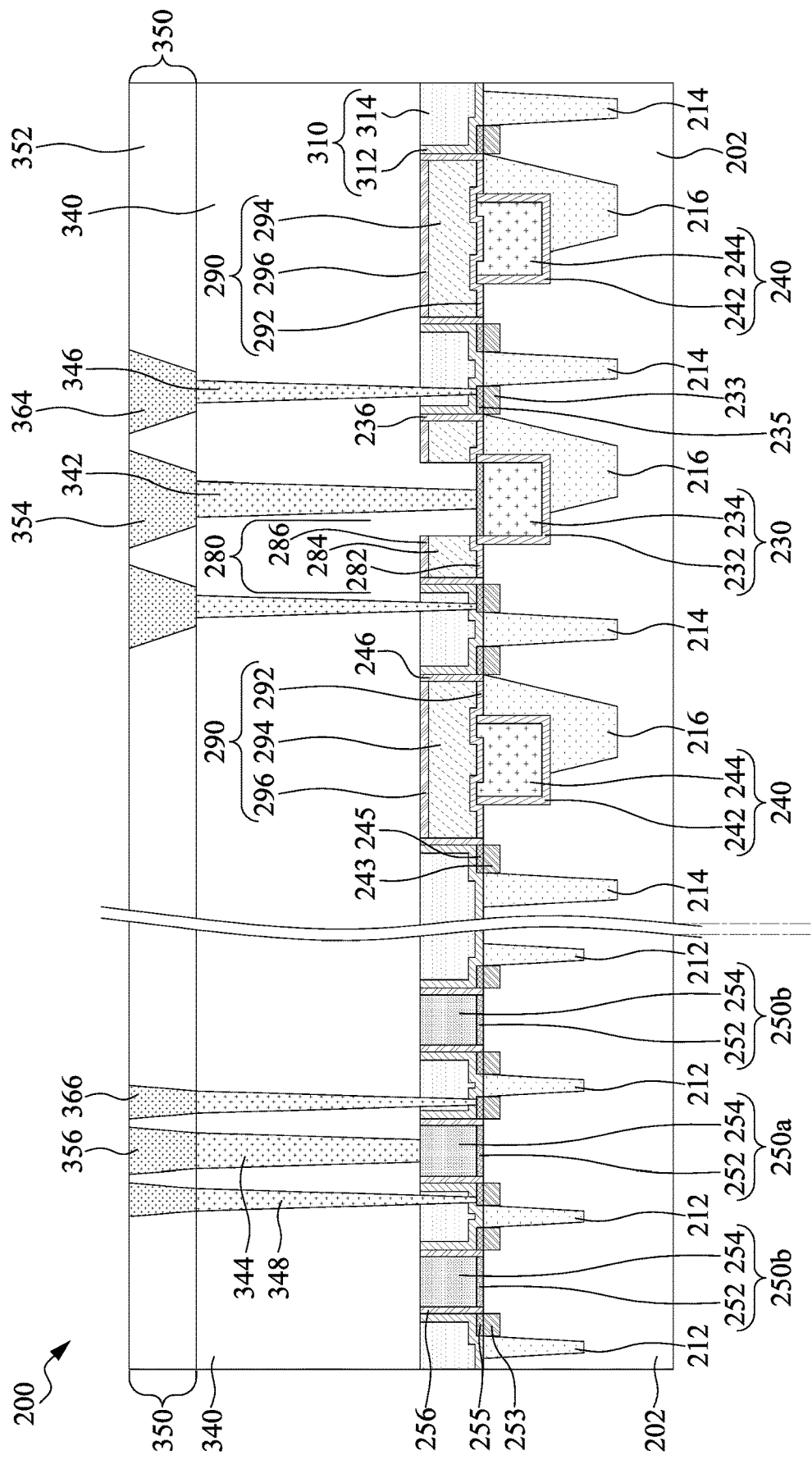

Referring to FIG. 21, an interconnect structure 350 is arranged over the dielectric layer 340. The interconnect structure 350 may comprise one or more inter-metal dielectric (IMD) layers 352. The IMD layer 352 may comprise, for example, one or more layers of an oxide, a low-k dielectric, or an ultra-low-k dielectric. The IMD layer 352 may surround one or more conductive lines (or metal wires and metal vias) 354 and 356 that comprise, for example, copper, tungsten, and/or aluminum. The contacting structure 342 may be configured to electrically couple the gate electrode 234 of the transistor device 230 to the conductive line 354 of the interconnect structure 350. In some embodiments, the contacting structure 346 is configured to electrically couple the source/drain regions 233 of the transistor device 230 to a conductive line 364 of the interconnect structure 350. The contacting structure 344 may be configured to electrically couple the gate electrode 254 of the transistor device 250a to the conductive line 356 of the interconnect structure 350. In some embodiments, the contacting structure 348 is configured to electrically couple the source/drain structures 253 of the transistor device 250a to a conductive line 366 of the interconnect structure 250.

In some embodiments, each transistor device 230 in the second region 202b is surrounded by one or more sacrificial gate structures 240. In some embodiments, the gate structures 240 are configured as dummy gate structures. Alternatively stated, the sacrificial gate structures 240 are electrically inactive. In some embodiments, the contacting structure 342 is electrically connected to the transistor device 230, while the sacrificial gate structures 240 are electrically isolated from the contacting structure 342. In some embodiments, the transistor device 230 is electrically connected to the conductive line 354, while the sacrificial gate structure 240 is electrically isolated from the conductive line 354.

In some embodiments, each transistor device 250a is surrounded by one or more gate structures 250b. In some embodiments, the gate structures 250b are configured as sacrificial gate structures or dummy gate structures. Alternatively stated, the gate structures 250b are electrically inactive. In some embodiments, the contacting structure 344 is electrically connected to the transistor device 250a, while the gate structures 250b are electrically isolated from the contacting structure 344. In some embodiments, at least an inactive sacrificial gate structure 240 or an inactive gate structure 250b is disposed between the transistor device 230 and the transistor device 250a.

The present disclosure provides embodiments of a semiconductor structure and forming method thereof that provide one or more improvements over existing approaches. By removing a portion of the gate masking structure overlapping the high-voltage device as introduced above, smaller or substantially no topography gaps may be formed between the high-voltage region and the low-voltage region. Accordingly, fewer non-correctable focus errors may be expected and device performance may thereby be improved.

In accordance with some embodiments of the present disclosure, a semiconductor structure is provided. The semiconductor structure includes a substrate, a first gate structure, a first contact, a sacrificial gate structure and a sacrificial gate masking structure. The substrate includes a region. The first gate structure is recessed in the substrate and disposed in the region. The first contact is electrically connected to the first gate structure. The sacrificial gate structure is recessed in the substrate and disposed in the region. The sacrificial gate structure is adjacent to the first gate structure. The sacrificial gate masking structure is disposed over the sacrificial gate structure. An upper surface of the sacrificial gate structure is entirely covered by the sacrificial gate masking structure.

In accordance with some embodiments of the present disclosure, a semiconductor structure is provided. The semiconductor structure includes a substrate, a first gate, a second gate, a sacrificial gate, a dielectric structure and a masking structure. The substrate includes a first region and a second region. The first gate is disposed over the substrate and disposed in the first region. The second gate is recessed in the substrate and disposed in the second region. The sacrificial gate is recessed in the substrate and disposed between the first gate and the second gate. The dielectric structure is disposed over the first gate, the second gate and the sacrificial gate. The masking structure is disposed over the sacrificial gate. The sacrificial gate is separated from the dielectric structure by the masking structure.

In accordance with some embodiments of the present disclosure, a method of forming a semiconductor structure is provided. The method includes the following operations. A substrate having a first region and a second region is provided. A first gate is formed in the first region, and a second gate and a sacrificial gate are formed in the second region. The second gate includes a first masking structure disposed thereon, and the sacrificial gate includes a second masking structure disposed thereon. A first patterned layer is formed over the first masking structure and the second masking structure. A first portion of the first masking structure is exposed through the first patterned layer. The first portion of the first masking structure is removed. A first silicide layer is formed over the second gate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate comprising a region;
a first gate structure recessed in the substrate and disposed in the region;
a first contact electrically connected to the first gate structure;
a sacrificial gate structure recessed in the substrate and disposed in the region, wherein the sacrificial gate structure is adjacent to the first gate structure;
a sacrificial gate masking structure over the sacrificial gate structure, wherein an upper surface of the sacrificial gate structure is entirely covered by the sacrificial gate masking structure; and
a first silicide layer over the first gate structure and electrically connecting the first gate structure to the first contact.

2. The semiconductor structure of claim 1, further comprising:
a first gate masking structure over a peripheral region of the first gate structure.

3. The semiconductor structure of claim 2, wherein the first contact is spaced apart from the first gate masking structure.

4. The semiconductor structure of claim 2, wherein an upper surface of the first gate masking structure is aligned with the upper surface of the sacrificial gate masking structure.

5. The semiconductor structure of claim 2, further comprising:
a dielectric structure over the first gate structure and the sacrificial gate structure, wherein the first gate masking structure laterally surrounds a portion of the dielectric structure, and the sacrificial gate structure is separated from the dielectric structure by the sacrificial gate masking structure.

6. The semiconductor structure of claim 5, further comprising:
a conductive line over the dielectric structure, wherein the first gate structure is electrically connected to the conductive line.

7. The semiconductor structure of claim 6, wherein the sacrificial gate structure is electrically isolated from the conductive line.

8. The semiconductor structure of claim 1, wherein the sacrificial gate structure is electrically inactive.

9. A semiconductor structure, comprising:
a substrate comprising a first region and a second region;
a first gate over the substrate and disposed in the first region;
a second gate recessed in the substrate and disposed in the second region;
a sacrificial gate recessed in the substrate and disposed between the first gate and the second gate;
a dielectric structure over the first gate, the second gate and the sacrificial gate; and
a masking structure over the sacrificial gate, wherein the sacrificial gate is separated from the dielectric structure by the masking structure.

10. The semiconductor structure of claim 9, wherein an upper surface of the masking structure is aligned with an upper surface of the first gate.

11. The semiconductor structure of claim 9, wherein an upper surface of the sacrificial gate entirely contacts a bottom surface of the masking structure.

12. The semiconductor structure of claim 9, further comprising:
a first conductive line and a second conductive line over the dielectric structure, wherein the first conductive line is disposed in the first region, and the second conductive line is disposed in the second region.

13. The semiconductor structure of claim 12, further comprising:
a first contact penetrating through the dielectric structure and electrically connecting the first conductive line to the first gate.

14. The semiconductor structure of claim 13, further comprising:
a second contact penetrating through the dielectric structure and electrically connecting the second conductive line to the second gate, wherein the sacrificial gate is electrically isolated from the second conductive line.

15. The semiconductor structure of claim 9, wherein the first gate is a metal gate and the second gate and the sacrificial gate are polysilicon gates.

16. A semiconductor structure, comprising:
a substrate;
a first gate structure recessed in the substrate;
a contact electrically connected to the first gate structure;
a second gate structure recessed in the substrate, wherein the second gate structure is adjacent to and separated from the first gate structure;
a first gate masking structure over the second gate structure, wherein an upper surface of the second gate structure is entirely covered by the first gate masking structure; and
a second gate masking structure over a peripheral region of the first gate structure, wherein the second gate structure is electrically inactive, and the contact is spaced apart from the second gate masking structure.

17. The semiconductor structure of claim 16, further comprising:
a dielectric structure over the first gate structure and the second gate structure, wherein the second gate masking structure laterally surrounds a portion of the dielectric structure, and the second gate structure is separated from the dielectric structure by the first gate masking structure.

18. The semiconductor structure of claim 17, further comprising:
a conductive line over the dielectric structure, wherein the first gate structure is electrically connected to the conductive line.

19. The semiconductor structure of claim 16, further comprising a pair of source/drain regions disposed in the substrate on opposite sides of the second gate masking structure.

20. The semiconductor structure of claim 16, further comprising an isolation structure disposed in the substrate, wherein the first gate structure is coupled to the isolation structure.

* * * * *